US007397847B2

(12) United States Patent
Ishida et al.

(10) Patent No.: US 7,397,847 B2
(45) **Date of Patent: *Jul. 8, 2008**

(54) TESTING DEVICE FOR TESTING ELECTRONIC DEVICE AND TESTING METHOD THEREOF

(75) Inventors: Masahiro Ishida, Tokyo (JP); Takahiro Yamaguchi, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 694 days.

This patent is subject to a terminal disclaimer.

(21) Appl. No.: 10/824,763

(22) Filed: Apr. 14, 2004

(65) Prior Publication Data

US 2005/0129104 A1 Jun. 16, 2005

Related U.S. Application Data

(63) Continuation-in-part of application No. 10/737,716, filed on Dec. 16, 2003, now Pat. No. 7,136,773.

(51) Int. Cl.
*H04B 3/46* (2006.01)

(52) U.S. Cl. ....................... 375/226; 370/516; 375/224; 375/371; 375/376; 398/155; 398/175; 714/704

(58) Field of Classification Search ................. 327/107; 375/226, 232, 235, 344, 371, 376; 714/704; 398/5, 155, 175; 385/24
See application file for complete search history.

(56) References Cited

U.S. PATENT DOCUMENTS 5,793,822 A * 8/1998 Anderson et al. ........... 375/371
2003/0202573 A1* 10/2003 Yamaguchi et al. ......... 375/226

OTHER PUBLICATIONS

Trischitta et al.; The Jitter Tolerance of Fiber Optic Regenerators; Dec. 1987; IEEE TRansactions on Communications; pp. 1303-1308.*

* cited by examiner

*Primary Examiner*—David C. Payne
*Assistant Examiner*—Adolf Dsouza
(74) *Attorney, Agent, or Firm*—Osha Liang LLP

(57) ABSTRACT

A testing device for testing an electronic device is provided. The testing device includes: a deterministic jitter application unit for applying deterministic jitter to a given input signal without causing an amplitude modulation component and supplying the input signal with the deterministic jitter to the electronic device; a jitter amount controller for controlling the magnitude of the deterministic jitter generated by the deterministic jitter application unit; and a determination unit for determining whether or not the electronic device is defective based on an output signal output from the electronic device in accordance with the input signal.

17 Claims, 15 Drawing Sheets

BEGIN

APPLY DETERMINISTIC JITTER TOINPUT SIGNAL (S302)

ADJUST JITTER AMOUNT (S304)

DETERMINE WHETHER OR NOT DUT IS DEFECTIVE BASED ON OUTPUT SIGNAL (S306)

END

FIG. 1A
(Prior Art)
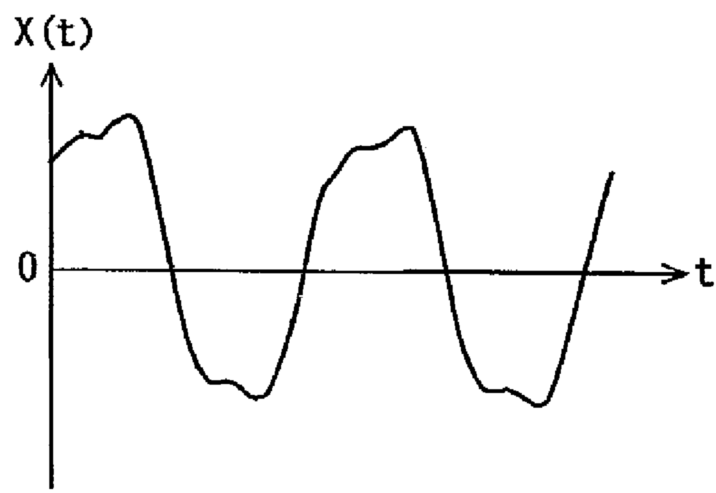
FIG. 1B
(Prior Art)
n(t)
0
t
FIG. 1C
(Prior Art)
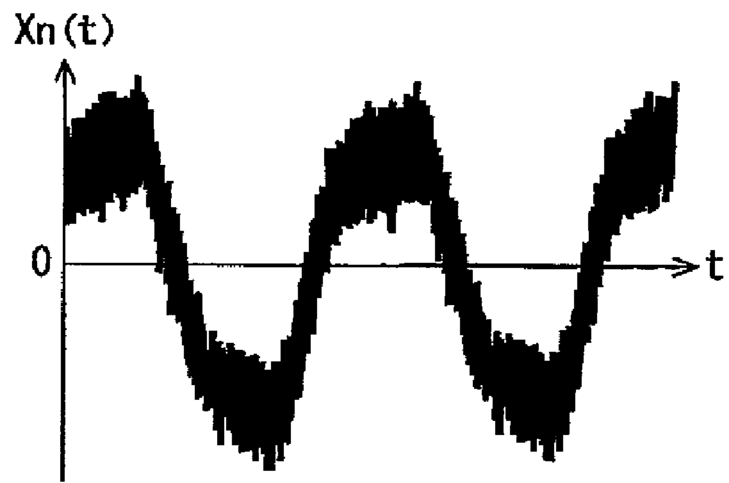

F/G. 12

TESTING DEVICE FOR TESTING ELECTRONIC DEVICE AND TESTING METHOD THEREOF

This patent application is a continuation-in-part application of U.S. application Ser. No. 10/737,716 filed on Dec. 16, 2003, the contents of which are incorporated herein by reference.

BACKGROUND OF THE INVENTION

1. Field of the Invention

The present invention relates to a testing device and a testing method for testing an electronic device. More particularly, the present invention relates to a testing device and a testing method for supplying an input signal with jitter applied thereto to an electronic device to perform a test of the electronic device.

2. Description of the Related Art

Jitter test is an important test to serial communication devices and serial I/O devices. For example, recommendations by International Telecommunication Union, Bellcore or the like define jitter tolerance, jitter generation and measurement of jitter transfer function. Especially, jitter tolerance test is important because it can estimate operating limits of a device to jitter applied in a transfer medium. Please note that the measurement of jitter tolerance changes an amplitude of jitter applied to an input signal of a device and measures a threshold value of the amplitude of the applied jitter which starts to cause the device to generate a bit error.

FIGS. 1A-1C illustrate conventional measurement of jitter tolerance. The conventional measurement of jitter tolerance applies random jitter to an input signal, that is shown in FIG. 1A, by superposing a white noise shown in FIG. 1B on the input signal. The input signal with the random jitter applied thereto is shown in FIG. 1C. The input signal with the random jitter applied thereto is supplied to an electronic device and a measurement is performed for determining whether or not a bit error occurs in the electronic device.

FIG. 2 illustrates a structure of a conventional jitter application device 200 for applying jitter to an input signal. To the input signal generated by a pattern generator 202, a sinusoidal jitter is applied by a sinusoidal jitter source 206 and deterministic jitter and random jitter are further applied by a deterministic jitter source 208 and a random jitter source 212. The amount of jitter applied to the input signal is adjusted by adjusting the amplitudes of the random jitter and sinusoidal jitter. Then, a limiting amplifier 214 amplifies the input signal and clips components having amplitudes that are equal to or larger than a predetermined amplitude and are equal to or smaller than another predetermined amplitude. After clipping, the signal is output.

FIGS. 3A-3C illustrates an operation of the limiting amplifier 214. To the limiting amplifier 214, an input signal shown in FIG. 3A is supplied. This input signal contains amplitude modulation components because random jitter was applied to the signal.

The limiting amplifier 214 removes amplitude components equal to or larger than the first threshold value and amplitude components equal to or smaller than the second threshold value from the input signal, as shown in FIG. 3B, thereby reducing the amplitude modulation components. However, the limiting amplifier 214 cannot remove the amplitude modulation components in ranges where the amplitude components are equal to or smaller than the first threshold value and are equal to or larger than the second threshold value. In order to measure jitter tolerance of an electronic device, it is necessary to supply an input signal with no amplitude modulated component, as shown in FIG. 3C, to the electronic device for detecting a bit error rate caused only by a jitter component in a phase direction. However, in the conventional jitter application device 200, the amplitude modulated components remain in the input signal, as shown in FIG. 3B. Thus, according to the conventional technique, a bit error caused by those amplitude modulation components is also detected. This results in underestimation of jitter tolerance of the electronic device. Moreover, the conventional jitter application device 200 includes three jitter sources, i.e., the sinusoidal jitter source 206, deterministic jitter source 208 and random jitter source 212. Thus, the cost of the device increases.

SUMMARY OF THE INVENTION

Therefore, it is an object of the present invention to provide a testing device and a testing method, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a testing device for testing an electronic device, comprises: a deterministic jitter application unit operable to apply deterministic jitter to a given input signal without causing an amplitude modulation component and supply the input signal to the electronic device; a jitter amount controller operable to control magnitude of the deterministic jitter generated by the deterministic jitter application unit; and a determination unit operable to determine whether or not the electronic device is defective based on an output signal output from the electronic device in accordance with the input signal.

The deterministic jitter application unit may include a primary filter operable to transmit the input signal and generate the deterministic jitter.

The deterministic jitter application unit may include a cable operable to transmit the input signal and generate the deterministic jitter.

The jitter amount controller may determine the magnitude of the deterministic jitter based on a threshold value of a peak-to-peak value of alignment jitter between the input signal and a recovered clock signal recovered by the electronic device from the input signal.

The testing device may further comprise a sinusoidal jitter application unit operable to apply sinusoidal jitter to the input signal, wherein the jitter amount controller further controls magnitude of the sinusoidal jitter generated by the sinusoidal jitter application unit.

The jitter amount controller may determine the magnitude of the sinusoidal jitter based on a threshold value of a peak-to-peak value of alignment jitter between the input signal and a recovered clock signal recovered by the electronic device from the input signal, and a jitter transfer function in a non-defective electronic device.

The jitter amount controller may determine the magnitude of the sinusoidal jitter based on a sinusoidal jitter threshold value obtained by multiplying the threshold value of the peak-to-peak value of the alignment jitter by a sinusoidal jitter ratio that is predetermined, and the jitter transfer function, and may determine the magnitude of the deterministic jitter based on a deterministic jitter threshold value obtained by subtracting the sinusoidal jitter threshold value from the threshold value of the peak-to-peak value of the alignment jitter, and the jitter transfer function.

The jitter amount controller may include a jitter transfer function estimation unit operable to obtain the jitter transfer function based on a timing jitter series of the input signal and a timing jitter series of the recovered clock signal recovered by the electronic device from the input signal.

The sinusoidal jitter application unit may apply the sinusoidal jitter having a plurality of frequency components to the input signal, and the jitter amount controller may determine magnitude of each of the frequency components of the sinusoidal jitter based on the threshold value of the peak-to-peak value of the alignment jitter and the jitter transfer function.

The jitter amount controller may determine the magnitude of each of the plurality of frequency components of the sinusoidal jitter based on a frequency-component threshold value obtained by multiplying the threshold value of the peak-to-peak value of the alignment jitter by a frequency-component ratio that is predetermined for that frequency component, and the jitter transfer function, and may determine the magnitude of the deterministic jitter based on a deterministic jitter threshold value obtained by subtracting a sum of the frequency-components threshold values corresponding to the plurality of frequency components, from the threshold value of the peak-to-peak value of the alignment jitter.

The electronic device may receive the input signal and a reference clock signal as its input and samples the input signal based on the reference clock signal, wherein the testing device further comprises a phase shifter operable to shift a phase of the reference clock signal.

According to the second aspect of the present invention, a testing device for testing an electronic device, comprises: a sinusoidal jitter application unit operable to apply sinusoidal jitter to a given input signal and supply the input signal with the sinusoidal jitter to the electronic device; a jitter amount controller operable to control magnitude of the sinusoidal jitter applied by the sinusoidal jitter application unit; and a determination unit operable to determine whether or not the electronic device is defective based on an output signal output from the electronic device in accordance with the input signal, wherein the jitter amount controller determines the magnitude of the sinusoidal jitter based on a threshold value of a peak-to-peak value of alignment jitter between the input signal and a recovered clock signal recovered by the electronic device from the input signal, and a jitter transfer junction in the electronic device that is non-defective.

According to the third aspect of the present invention, a testing method for testing an electronic device, comprises: applying deterministic jitter to a given input signal without causing an amplitude modulation component and supplying the input signal with the deterministic jitter to the electronic device; controlling magnitude of the deterministic jitter applied in the application of the deterministic jitter; and determining whether or not the electronic device is defective based on an output signal output from the electronic device in accordance with the input signal.

The deterministic jitter may be generated by using a primary filter that transmits the input signal in the application of the deterministic jitter.

The deterministic jitter may be generated by using a cable that transmits the input signal in the application of the deterministic jitter.

The testing method may further comprise applying sinusoidal jitter to the input signal.

The sinusoidal jitter having a plurality of frequency components may be applied to the input signal in the application of the sinusoidal jitter.

According to the fourth aspect of the present invention, a testing method for testing an electronic device, comprises: applying sinusoidal jitter to a given input signal and supplying the input signal with the sinusoidal jitter to the electronic device; controlling magnitude of the sinusoidal jitter applied in the application of the sinusoidal jitter; and determining whether or not the electronic device is defective based on an output signal output from the electronic device in accordance with the input signal, wherein the controlling of the magnitude of the sinusoidal jitter determines the magnitude of the sinusoidal jitter based on a threshold value of a peak-to-peak value of alignment jitter between the input signal and a recovered clock signal recovered by the electronic device from the input signal, and a jitter transfer function of the electronic device that is non-defective.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIGS. 1A-1C illustrate conventional measurement of jitter tolerance.

FIG. 3A shows an input signal; FIG. 3B shows a signal output from the limiting amplifier 214; and FIG. 3C shows an input signal containing no amplitude modulated component.

FIG. 9A shows a step response of a primary filter; and FIG. 9B shows a step response of a secondary filter.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

First, the principle of a testing device and a testing method according to the present invention is described.

(1) Device Under Test

Figure 4A:
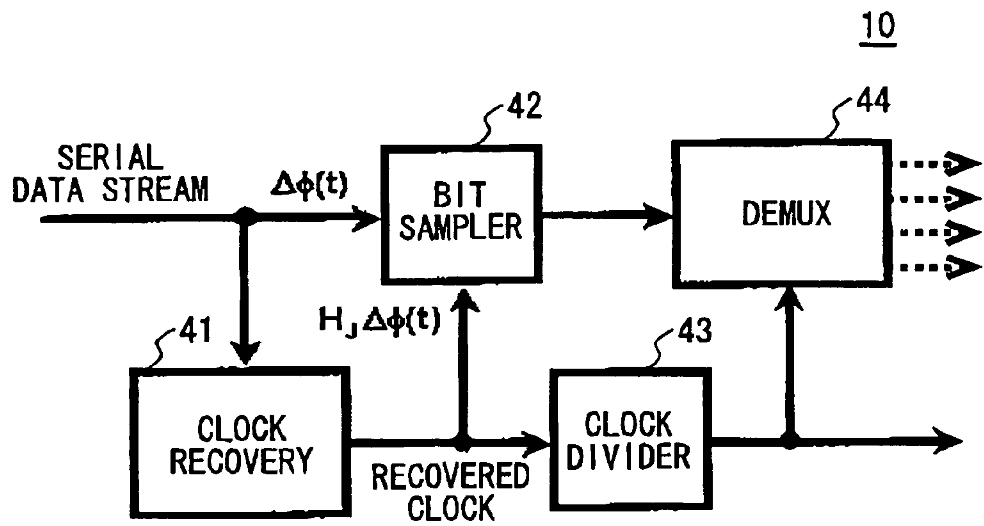
FIGS. 4A and 4B illustrate the first and second exemplary structures of an electronic device 10 according to an embodiment of the present invention, respectively.
Figure 4B:
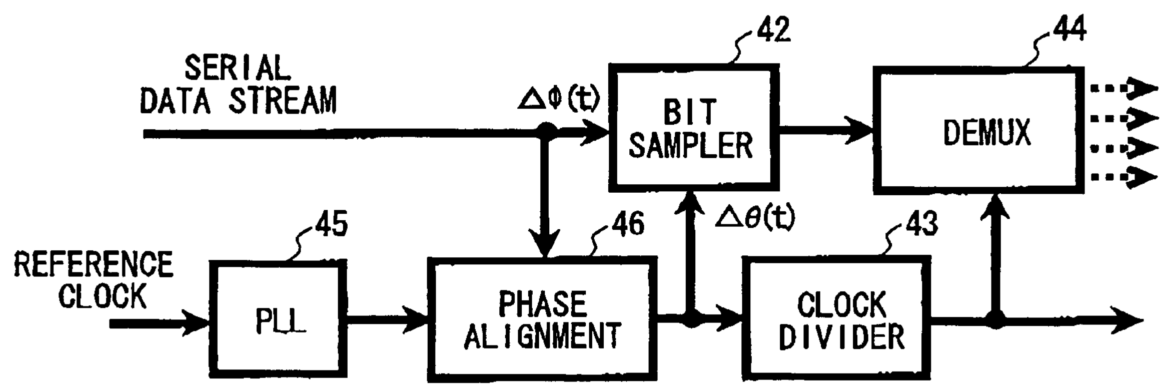

FIGS. 4A and 4B show exemplary structures of an electronic device 10 according to one embodiment of the present invention. FIG. 4A shows the first exemplary structure of the electronic device 10. The electronic device 10 of this embodiment is a deserializer, for example, and includes a clock recovery circuit 41, a bit sampler 42, a clock divider 43 and a demultiplexer (DEMUX) 44. The clock recovery circuit 41 recovers a clock signal from an input signal of a serial data stream and outputs the recovered clock signal. The bit sampler 42 performs sampling of the input signal of serial data stream based on the recovered clock signal. The clock divider 43 divides the recovered clock signal. The demultiplexer 44 performs serial-to-parallel conversion for a bit stream obtained by the sampling by the bit sampler 42, using the recovered clock signal that was divided by the clock divider 43 so as to output 16-bit recovered data.

When a rising edge in the input signal of serial data stream fluctuates because of jitter or the sampling timing fluctuates because of jitter of the recovered clock signal, timings of adjacent rising edges in the input signal cross the sampling timings, respectively. As a result, the bit sampler 42 may sample a preceding or next bit of the bit to be sampled, thus causing a bit error in recovered data output from the demultiplexer 44.

FIG. 4B shows the second example of the structure of the electronic device 10. The components in FIG. 4B that are labeled with the same reference numerals as those in FIG. 4A have the same structures and functions as the components described in conjunction with FIG. 4A, except for the following. The electronic device 10 of this example includes a PLL 45, a phase alignment unit 46, a bit sampler 42, a clock divider 43 and a demultiplexer 44. The electronic device 10 receives a data signal (input signal) and a reference clock signal as its input and samples the data signal based on the reference clock signal.

The PLL 45 receives the reference clock signal as its input and generates a sampling clock used in the sampling of the input signal. In this example, the sampling clock generated by the PLL 45 has a frequency that is N times higher than the frequency of the input signal. The phase alignment unit 46 adjusts the phase of the sampling clock with respect to the input signal. The bit sampler 42 samples the input signal at N sampling timings per cycle, using the sampling clock having the phase thus adjusted, and recovers a bit stream by using the data sampled at one of those sampling timings that provides the lowest error rate.

When a rising edge of the input signal fluctuates because of jitter or the sampling timing fluctuates because of jitter thereof, the timings of the adjacent rising edges of the input signal cross the sampling timings, respectively. As a result, the bit sampler 42 may sample the preceding or next bit of the bit to be sampled, thus causing a bit error in the recovered data output from the demultiplexer 44.

In a case of the electronic device 44 shown in the second example, a phase difference that is up to 1/N UI (Unit Interval) occurs between the input signal and the sampling clock because of a static phase difference between the input signal and the reference clock signal. Such a phase difference occurring between the input signal and the sampling clock provides alignment jitter described below with an offset. Thus, a margin of timing in recovery of the bit stream by the bit sampler 423 becomes smaller and therefore a bit error can occur more easily.

(2) Alignment Jitter

Alignment jitter is an alignment error between timing jitter of an input data stream as an input signal, $\Delta\theta[nT]$, and timing jitter of the recovered clock signal, $\Delta\phi[nT]$. See "Jitter in Digital Transmission Systems" by Patrick R. Trischitta and Eve L. Varma, Artech House, p. 86, 1989. The alignment jitter can be obtained from Expression (1).

$$\Delta\mathrm{align}[nT]=\Delta\phi[nT]-\Delta\theta[nT] \quad (1)$$

The electronic device 10 generates the alignment error between the input data stream and the recovered clock, i.e., a bit error rate when the alignment jitter exceeds a threshold value.

Figure 5:
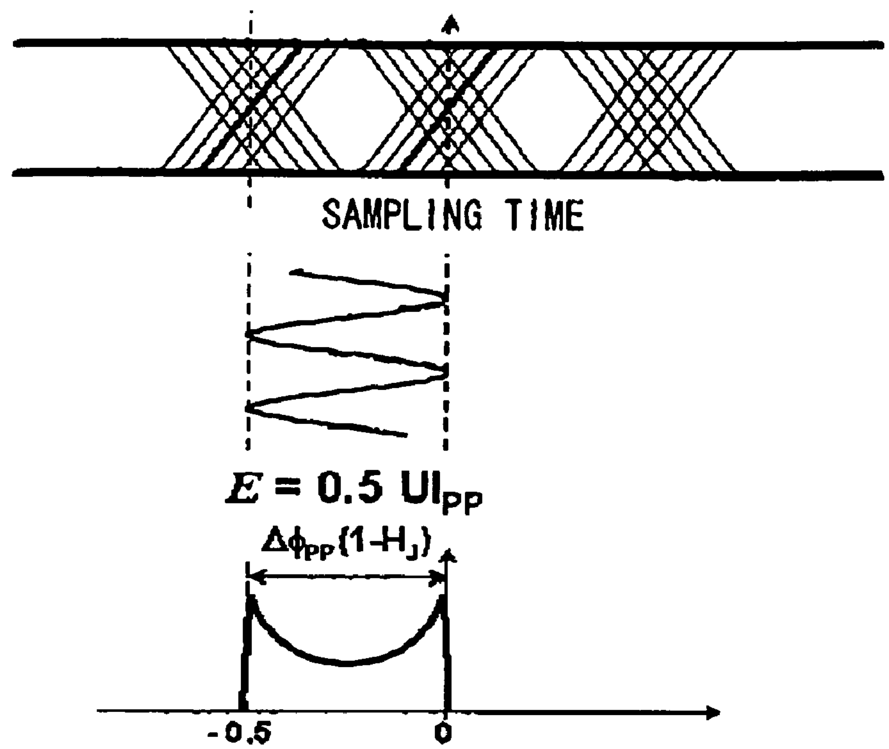
FIG. 5 schematically shows alignment jitter in the worst case.

FIG. 5 schematically shows the alignment jitter in the worst case in a range causing no bit error. In the worst case, a boundary of a recovered bit swings between 0 UI and 0.5 UI because of the alignment jitter. Moreover, when the amplitude of the alignment jitter exceeds 0.5 $UI_{pp}$, for example, the electronic device 10 causes the bit error.

(3) Jitter Transfer Function

Next, a procedure for obtaining a jitter transfer function from timing jitter is described. By making a sampling period Ts of sampling by a testing device equal to a clock period T of a clock recovery circuit 41 under test and re-sampling an instantaneous noise $\Delta\theta(t)$ or $\Delta\phi(t)$ around a zero-crossing (rising or falling edge), input timing jitter $\Delta\theta[nT]$ and output timing jitter $\Delta\phi[nT]$ can be obtained. Then, by transforming $\Delta\theta[nT]$ and $\Delta\phi[nT]$ into a frequency domain in accordance with Fourier transformation, an input timing jitter spectrum and an output timing jitter spectrum, that are represented by Expressions (2) and (3), respectively, can be obtained (Takahiro J. Yamaguchi, Mani Soma, Louis Malarsie, Masahiro Ishida, Hirobumi Musha, "Timing Jitter Measurement of 10 Gbps Bit Clock Signals Using Frequency Division," Proc. IEEE VLSI Test Symposium, Monterey, USA, Apr. 28-May 2, 2002).

$$\Delta\Theta[f_J]=\frac{1}{L}\sum_{k=0}^{L}\Delta\theta(kT)\exp\left(-j\frac{2\pi f_J k}{L}\right) \quad (2)$$

$$\Delta\Phi[f_J]=\frac{1}{L}\sum_{k=0}^{L}\Delta\phi(kT)\exp\left(-j\frac{2\pi f_J k}{L}\right) \quad (3)$$

Timing jitter is wide-sense cyclostationary with a period T. Therefore, the use of the timing jitter spectrum is more effective in analysis of a modulation noise source, as compared with a case of using a phase noise spectrum. It should be noted that, when the timing jitter is filtered by a narrow-band filter and is transformed from a wide-sense cyclostationary signal to a stationary signal, Expressions (4) and (5) are satisfied.

$$\Delta\Theta(f_j)\approx\Delta\Theta[f_j] \quad (4)$$

$$\Delta\Phi(f_j)\approx\Delta\Phi[f_j] \quad (5)$$

Thus, by using a narrow-band filter as described in Recommendations (see "ITU-T, Recommendation G. 958: Digital Line Systems Based on the Synchronous Digital Hierarchy for Use on Optical Fibre Cables, November 1994", "ITU-T, Recommendation O.172: Jitter and Wander Measuring Equipment for Digital Systems Which are Based on the Synchronous Digital Hierarchy (SDH), March 1999", and "Bellcore, Generic Requirements GR-1377-Core: SONET OC-192 Transport System Genetic Criteria, December 1998"), sampling at zero-crossings (that corresponds to a process related to a wide-sense cyclostationary signal) can be avoided.

Jitter transfer function $H_J(f_J)$ can be estimated from the timing jitter spectra shown by Expressions (2) and (3) (or (4) and (5)) by using Expressions (6), (7) and (8) described below.

$$H_J(f_J)=|H_J(f_J)|\exp(-j\Delta\Psi(f_J)) \quad (6)$$

$$H_J(f_J)=\frac{\Delta\Phi[f_J]}{\Delta\Theta[f_J]} \quad (7)$$

$$\Delta\Psi(f_J)=\angle\Delta\Phi[f_J]-\angle\Delta\Theta[f_J] \quad (8)$$

Moreover, the jitter transfer function can be obtained by using a cross spectrum between the input timing jitter and the output timing jitter, and a power spectrum of the input timing jitter.

$$H_J(f_J)=\frac{\Delta\Phi[f_J]\Delta\Theta^*[f_J]}{\Delta\Theta[f_J]\Delta\Theta^*[f_J]} \quad (9)$$

Figure 6:
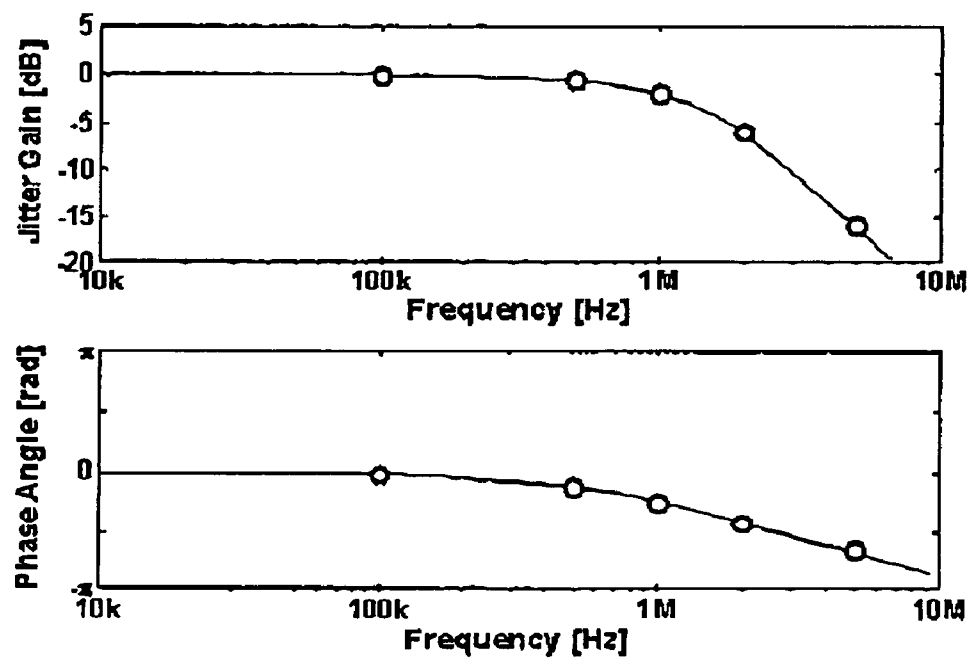
FIG. 6 shows an exemplary jitter transfer function of the electronic device 10.

FIG. 6 shows an exemplary jitter transfer function of the electronic device 10.

Furthermore, from Expression (7) and linearity of Fourier transform, the input timing jitter $\Delta\theta[nT]$ and the output timing jitter $\Delta\phi[nT]$ have a relationship represented by Expression (10).

$$\Delta\theta[nT]=H_J(f_J)\Delta\phi[nT] \quad (10)$$

Please note that $H_J(f_J)$ in the above expressions is complex number.

(4) Determination of the Magnitude of Jitter (4-1) Case where Sinusoidal Jitter is Applied Next, in a case where sinusoidal jitter having a jitter frequency $f_J$, represented by Expression (11), is applied to a data stream input to the electronic device 10, determination of the magnitude of jitter is described.

$$\Delta\theta[nT]=\frac{A}{2}\cos(2\pi f_J nT+\varphi)\ [UI] \quad (11)$$

In Expression (11), A and $\phi$ represent the amplitude and initial phase of the sinusoidal jitter, respectively.

Assuming that the jitter transfer function of the electronic device 10 at a jitter frequency f is $H_J(f)$, timing jitter appearing in the recovered clock recovered by the clock recovery circuit 41 is represented by Expression (12).

$$\Delta\phi[nT]=H_J(f_J)\frac{A}{2}\cos(2\pi f_J nT+\varphi)\ [UI] \quad (12)$$

From Expressions (1), (11) and (12), alignment jitter represented by the following expression is obtained.

$$\Delta\text{align}\,[nT]=\{H_J(f_J)-1\}\frac{A}{2}\cos(2\pi f_J nT+\varphi)\ [UI] \quad (13)$$

When a peak-to-peak value of the alignment jitter, $\Delta align_{PP}$ has exceeded a threshold value $\Delta_{th,PP}$ (for example, 0.5 $UI_{pp}$), the electronic device 10 generates a bit error. Thus, a condition for preventing the electronic device 10 from generating the bit error is represented by the following expression.

$$\Delta align_{PP}=A\cdot|H_J(f_J)-1|<\Delta_{th,PP}[UI_{pp}] \quad (14)$$

In the testing device and testing method according to the present embodiment, the amplitude A that satisfies Expression (13) is calculated, thereby determining the magnitude of the sinusoidal jitter to be applied to the electronic device 10. By applying the sinusoidal jitter represented by Expression (11) with the calculated amplitude A to the input data stream and determining whether or not the electronic device 10 generates a bit error, it can be determined whether or not the electronic device 10 is a defective device in which jitter tolerance at a jitter frequency $f_J$ is deteriorated.

(4-2) Case where Multi-Tone Sinusoidal Jitter is Applied

Next, in a case where multi-tone sinusoidal jitter represented by Expression (15) is applied to a data stream input to the electronic device 10, determination of the magnitude of jitter is described. Please note that the multi-tone sinusoidal jitter means sinusoidal jitter obtained by combining a plurality of types of sinusoidal jitter that respectively correspond to a plurality of frequency components (jitter frequencies) $f_k$ (k=1, 2, . . . , N).

$$\Delta\theta[nT]=\sum_{k=1}^{N}\frac{A_k}{2}\cos(2\pi f_k nT+\varphi_k)\ [UI] \quad (15)$$

In Expression (15), $A_k$ and $\phi_k$ represent the amplitude and the initial phase of the sinusoidal jitter having the jitter frequency $f_k$.

In a case where this multi-tone sinusoidal jitter is applied, the timing jitter appearing in the recovered clock recovered by the clock recovery circuit 41 is represented as follows.

$$\Delta\varphi[nT]=\sum_{k=1}^{N}H_J(f_k)\frac{A_k}{2}\cos(2\pi f_k nT+\varphi_k)\ [UI] \quad (16)$$

From Expressions (1), (15) and (16), alignment jitter represented by the following expression is obtained.

$$\Delta\text{align}\,[nT]=\sum_{k=1}^{N}\{H_J(f_k-1)\}\frac{A_k}{2}\cos(2\pi f_k nT+\varphi_k)\ [UI] \quad (17)$$

When a peak-to-peak value of the alignment jitter, $\Delta align_{PP}$ has exceeded a threshold value $\Delta_{th,PP}$ (for example, 0.5 $UI_{pp}$), the electronic device 10 generates a bit error. Thus, a condition for preventing the electronic device 10 from generating the bit error is represented by the following expression.

$$\Delta align_{PP} < \sum_{k=1}^{N} A_k \cdot |H_j(f_k) - 1| < \Delta_{th,PP} \ [UI_{PP}] \tag{18}$$

In the testing device and testing method according to the present embodiment, the amplitude A that satisfies Expression (13) is calculated, thereby determining the magnitude of the sinusoidal jitter to be applied to the electronic device 10. By applying the sinusoidal jitter represented by Expression (15) with the calculated amplitude A to the input data stream and determining whether or not the electronic device 10 generates a bit error, it can be determined whether or not the electronic device 10 is a defective device in which jitter tolerance at any of jitter frequencies $f_k$ (k=1, 2, . . . N) is deteriorated.

In the above description, the amplitude $A_k$ of each sinusoidal jitter to be applied to the input data stream is set so as to satisfy Expression (18). However, the amplitude $A_k$ at each jitter frequency $f_k$ may be set the same value or a value with a weight corresponding to the level of importance of that jitter frequency $f_k$ at which test is performed.

(4-3) Case where Deterministic Jitter is Applied

Next, in a case where deterministic jitter represented by Expression (19) is applied to a data stream input to the electronic device 10, determination of the magnitude of the jitter is described.

$$\Delta\theta[nT] = \int_0^{f_{max}} \frac{A(f)}{2} \cos(2\pi fnT + \varphi(f)) df \ [UI] \tag{19}$$

Assuming that the jitter transfer function of the electronic device 10 at a jitter frequency f is $H_J(f)$, timing jitter appearing in the recovered clock recovered by the clock recovery circuit 41 is represented by Expression (20).

$$\Delta\phi[nT] = \int_0^{f_{max}} H_J(f) \frac{A(f)}{2} \cos(2\pi fnT + \varphi(f)) df \ [UI] \tag{20}$$

In the above, A(f) and $\phi(f)$ represent the amplitude and the initial phase of the jitter at the frequency f.

From Expressions (1), (19) and (20), alignment jitter represented by the following expression is obtained.

$$\Delta align[nT] = \int_0^{f_{max}} \{H_J(f) - 1\} \frac{A(f)}{2} \cos(2\pi fnT + \varphi(f)) df \ [UI] \tag{21}$$

When a peak-to-peak value of the alignment jitter, $\Delta align_{PP}$ has exceeded a threshold value $\Delta_{th,PP}$ (for example, 0.5 $UI_{pp}$), the electronic device 10 generates a bit error. Thus, a condition for preventing the electronic device 10 from generating the bit error is represented by the following expression.

$$\Delta align_{PP} \equiv \left| \int_0^{f_{max}} \{H_J(f) - 1\} \frac{A(f)}{2} \cos(2\pi fnT + \varphi(f)) df \right| < \Delta_{th,PP} \tag{22}$$

Figure 7:
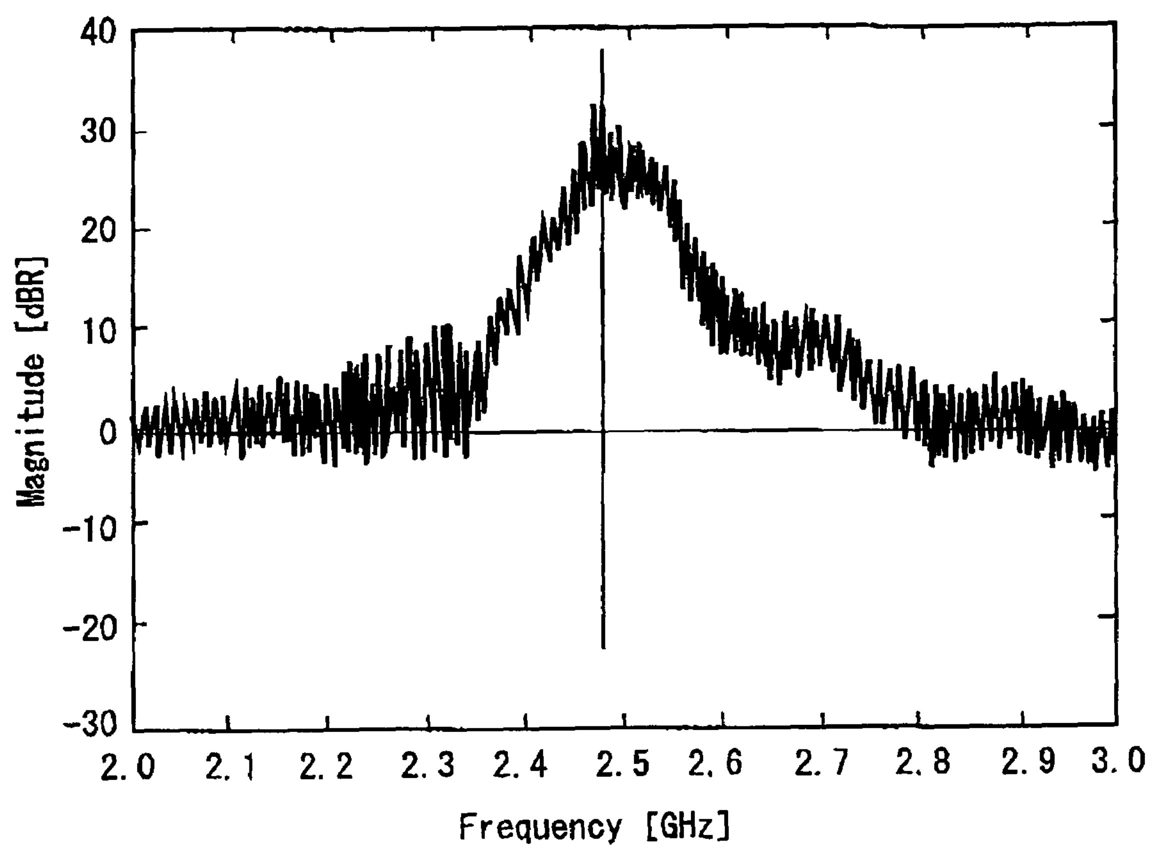
FIG. 7 shows an exemplary spectrum of an input signal transferred in a cable.

FIG. 7 shows an exemplary spectrum of an input signal transmitted in a cable. In this example, the carrier frequency of the input signal is 2.5 Gbps and the length of the cable is 20 m. As shown in FIG. 7, a side band of a band that is as broad as 200 MHz on each side of the carrier frequency, appears in the spectrum of the input signal near the carrier frequency. In other words, deterministic jitter applied to the input signal has a frequency component of about 200 MHz that is sufficiently higher than a cut-off frequency of a loop filter. Thus, the deterministic jitter has energy in a frequency band (several hundred megahertz to several gigahertz) that is broader than a loop band $f_{bound}$ (that is typically about 1 MHz) of the electronic device 10, such as a deserializer, clock recovery device or PLL. Moreover, the jitter transfer function outside the loop band of the electronic device 10 is approximately zero, as shown in FIG. 7. Therefore, alignment jitter caused by the jitter in the loop band is negligible as compared with alignment jitter caused by the jitter outside the loop band, and Expression (23) is established.

$$\int_0^{f_{bound}} \{H_J(f) - 1\} \frac{A(f)}{2} \cos(2\pi fnT + \varphi(f)) df << \int_{f_{bound}}^{f_{max}} \{H_J(f) - 1\} \frac{A(f)}{2} \cos(2\pi fnT + \varphi(f)) df \tag{23}$$

Thus, the alignment jitter represented by Expression (21) can be changed as follows.

$$\begin{aligned} \Delta align[nT] &\approx \int_{f_{bound}}^{f_{max}} \{H_J(f) - 1\} \frac{A(f)}{2} \cos(2\pi fnT + \varphi(f)) df \\ &\approx -\int_{f_{bound}}^{f_{max}} \frac{A(f)}{2} \cos(2\pi fnT + \varphi(f)) df \ [UI] \\ &\approx -\Delta\theta[nT] \end{aligned} \tag{24}$$

In Expression (24), $|H_J(f>f_{bound})| \approx 0$ was used.

The condition represented by Expression (22) is also changed by using Expression (24), as follows.

$$\Delta align_{PP} \approx \Delta\theta_{PP} < \Delta_{th,PP} [UI_{pp}] \tag{25}$$

In Expression (25), $\Delta\theta_{pp}$ represents a peak-to-peak value of deterministic jitter applied to the input data stream.

In the testing device and testing method according to the present embodiment, the amplitude of deterministic jitter is determined so as to satisfy Expression (22) or (25). Then, applying the deterministic jitter thus determined to the input data stream and determining whether or not the electronic device 10 generates a bit error, it can be determined whether or not the electronic device 10 is a defective device in which jitter tolerance outside the loop band thereof is deteriorated.

(4-4) Case where Multi-Tone Sinusoidal Jitter and Deterministic Jitter are Applied Next, determination of the magnitude of jitter is described in a case where sinusoidal jitter having a plurality of frequency components of jitter frequencies fk (k=1, 2, . . . , N), represented by Expression (26), and deterministic jitter represented by Expression (27) are applied to a data stream input to the electronic device 10.

$$\Delta\theta_{multi\text{-}tone}[nT] = \sum_{k=1}^{N} \frac{A_k}{2}\cos(2\pi f_k nT + \varphi_k)\ \ [UI] \tag{26}$$

$$\Delta\theta_{deterministic}[nT] = \int_0^{f_{max}} \frac{A(f)}{2}\cos(2\pi f nT + \varphi(f))df\ \ [UI] \tag{27}$$

Assuming that a jitter transfer function of a device under test at a jitter frequency f is $H_J(f)$, timing jitter appearing in the recovered clock recovered by the clock recovery circuit 41 is represented by Expression (28).

$$\Delta\phi[nT] = \sum_{k=1}^{N} H_J(f_k)\frac{A_k}{2}\cos(2\pi f_k nT + \varphi_k) + \int_0^{f_{max}} H_J(f_k)\frac{A(f)}{2}\cos(2\pi f nT + \varphi(f))df\ \ [UI] \tag{28}$$

Thus, alignment jitter is represented by the following expression.

$$\begin{aligned}\Delta align[nT] &= \sum_{k=1}^{N}\{H_J(f_k)-1\}\frac{A_k}{2}\cos(2\pi f_k nT + \varphi_k) + \int_0^{f_{max}}\{H_J(f_k)-1\}\frac{A(f)}{2}\cos(2\pi f nT + \varphi(f))df \\ &= \sum_{k=1}^{N}\{H_J(f_k)-1\}\frac{A_k}{2}\cos(2\pi f_k nT + \varphi_k) - \Delta\theta_{deterministic}[nT]\end{aligned} \tag{29}$$

When a peak-to-peak value of the alignment jitter, $\Delta align_{PP}$ has exceeded a threshold value $\Delta_{th,PP}$ (for example, 0.5 $UI_{pp}$), the electronic device 10 generates a bit error. Thus, a condition for preventing the electronic device 10 from generating the bit error is given by the following expression.

$$\Delta align_{PP} < \sum_{k=1}^{N} A_k \cdot \left| H_J(f_k) - 1 \right| + \Delta\theta_{deterministic,PP} < \Delta_{th,PP}\ \ [UI_{PP}] \tag{30}$$

In this calculation, it is assumed that the alignment jitter caused by the jitter inside the loop band is negligible as compared with the alignment jitter caused by the jitter outside the loop band (Expression (23)).

In the testing device and testing method according to the present embodiment, the amplitude of sinusoidal jitter at each frequency component and the amplitude of deterministic jitter are determined so as to satisfy Expression (29). Then, the sinusoidal jitter and the deterministic jitter thus determined are applied to the input data stream, thereby determining whether or not the electronic device 10 generates a bit error. Thus, according to the testing device and testing method of the present embodiment, it is possible to determine a defective device having jitter tolerance deteriorated at any of jitter frequencies $f_k$ (k=1, 2, . . . N) or jitter tolerance deteriorated outside the loop band of that device.

In the above determination, the amplitude of the deterministic jitter and the amplitude of each sinusoidal jitter, that are to be applied to the input data stream, are set so as to satisfy Expression (30). However, the amplitude of the deterministic jitter and that of the multi-tone sinusoidal jitter are set to the same value. Alternatively, they may be set to have appropriate weights corresponding to levels of importance of the jitter frequency band (inside or outside the loop band) to be tested.

(5) Determination of a Threshold Value of Alignment Jitter

The threshold value $\Delta_{th,PP}$ may be set to 0.5 $UI_{pp}$ from the alignment jitter in the worst case or may be obtained from the lower limit of jitter tolerance of the electronic device 10 that is not defective. Alternatively, the threshold value $\Delta_{th,PP}$ may be obtained from a typical value of jitter tolerance of the electronic device 10 or a specification value of jitter tolerance defined by the test specification for the electronic device 10, for example, ITU-T G.958 test specification for an SDH device. Moreover, the threshold value $\Delta_{th,PP}$ may be set by a person who performs a test.

(6) Random Jitter

Random jitter outside the loop band of the electronic device 10 can be handled as deterministic jitter like Expression (19). Random jitter inside the loop band of the electronic device 10 can be handled as multi-tone sinusoidal jitter like Expression (15).

Figure 8:
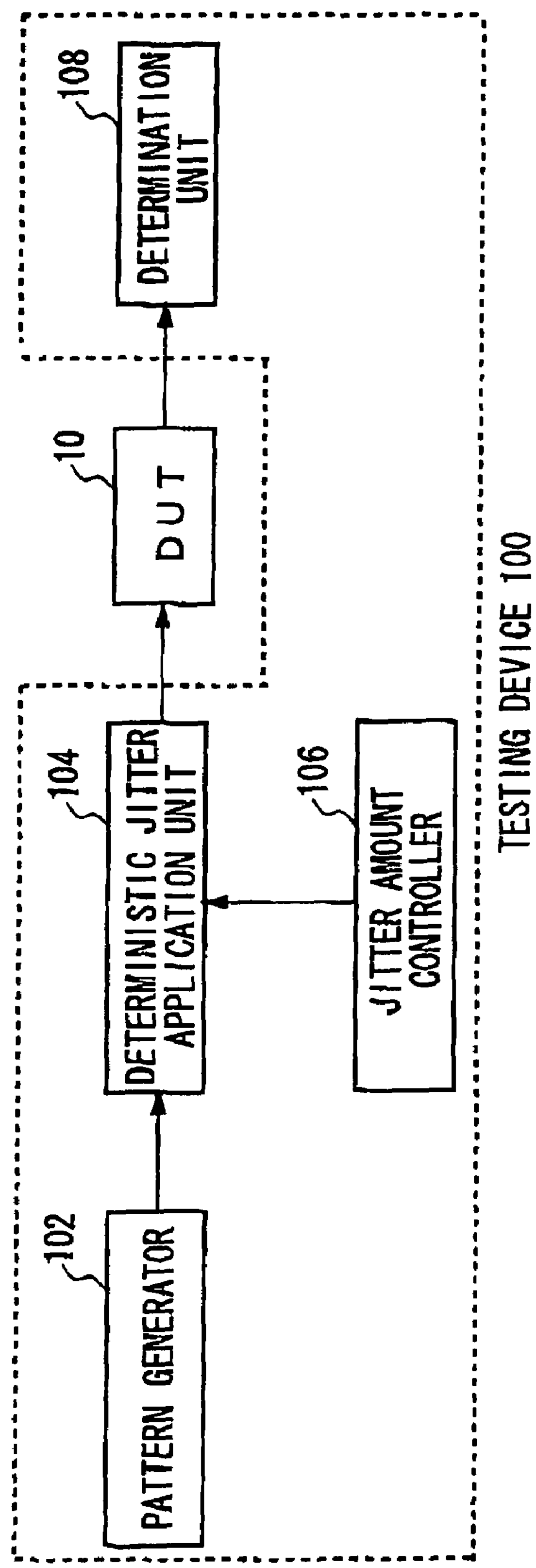
FIG. 8 shows an exemplary structure of a testing device 100 according to one embodiment of the present invention.

FIG. 8 illustrates an exemplary structure of a testing device 100 according to one embodiment of the present invention. The testing device 100 tests jitter tolerance of an electronic device 10, and includes a pattern generator 102, a deterministic jitter application unit 104, a jitter amount controller 106, and a determination unit 108. The electronic device 10 is a serial communication device or serial I/O device, for example. However, the electronic device 10 is not limited thereto. The electronic device 10 may be an electronic circuit, a system including an electronic circuit, or the like.

The pattern generator 102 generates an input signal (input data stream) to be supplied to the electronic device 10. The deterministic jitter application unit 104 receives the input signal generated by the pattern generator 102, applies deterministic jitter to the input signal without causing an amplitude modulation component in the input signal, and supplies the input signal with the deterministic jitter to the electronic device 10. The deterministic jitter is jitter depending on a signal pattern of the input signal, for example.

For example, the deterministic jitter application unit 104 may be a primary filter that applies deterministic jitter to the input signal by allowing the input signal to pass therethrough. The primary filter is an RC filter, for example. In this case, it is preferable that a resistance component and a capacitance component in the primary filter be variable.

The deterministic jitter application unit 104 may include a cable that applies deterministic jitter to the input signal by transmitting the input signal. In this case, it is preferable that the deterministic jitter application unit 104 include a plurality of cables having different lengths that are provided in parallel.

The deterministic application unit 104 may include a limiting amplifier for removing the amplitude modulation component of the input signal.

The jitter amount controller 106 controls the magnitude of the deterministic jitter the deterministic jitter application unit 104 generates and applies to the input signal. In a case where the deterministic jitter application unit 104 generates deterministic jitter by means of a primary filter, for example, the jitter amount controller 106 controls the resistance of the resistance component and the capacitance of the capacitance component in the primary filter, thereby controlling the magnitude of the deterministic jitter to be applied.

In a case where the deterministic jitter application unit 104 includes a plurality of cables, the jitter amount controller 106 selects one of the cables that transmits the input signal, thereby controlling the magnitude of the deterministic jitter generated by the cable.

The determination unit 108 detects a bit error in an output signal from the electronic device 10 in accordance with the input signal, thereby determining whether or not the electronic device 10 is defective. In this detection, the determination unit 108 receives an expected value signal that is to be compared with the output signal, from the pattern generator 102, and detects the bit error rate by comparing a bit of the output signal and a bit of the expected value signal.

By performing the above detection of the bit error for every magnitude of the deterministic jitter to be applied, jitter tolerance of the electronic device 10 can be measured. More specifically, the jitter amount controller 106 gradually changes the magnitude of the deterministic jitter, and the determination unit 108 detects the bit error in the output signal for every magnitude of the deterministic jitter changed by the jitter amount controller 106. Then, a specification value of jitter tolerance of the electronic device 10 or the like is compared with jitter tolerance actually measured, thereby it is determined whether or not the electronic device 10 is defective.

The testing device 100 may perform measurement only near the specification value of jitter tolerance of the electronic device 10.

Figure 9A:
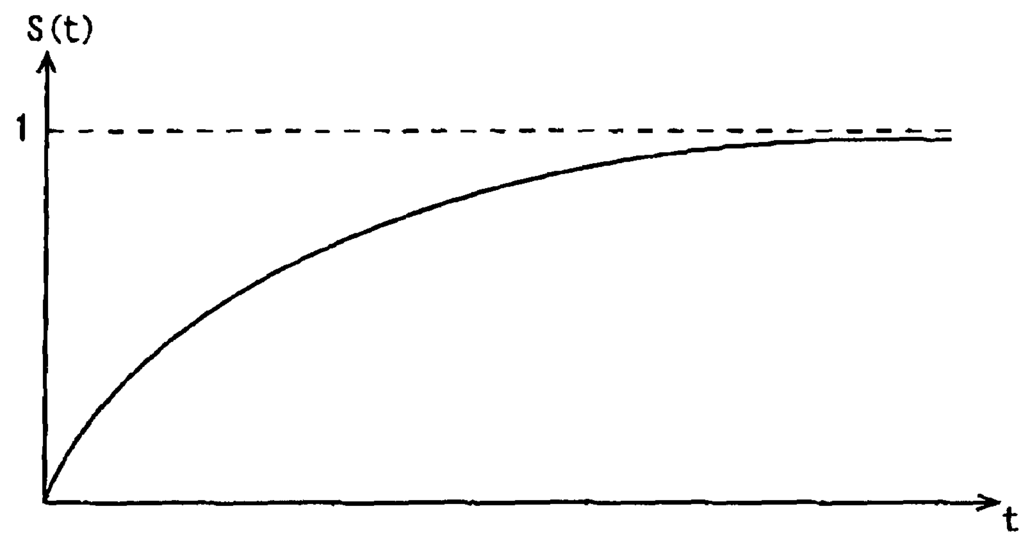
FIGS. 9A and 9B show an exemplary step response of a filter.
Figure 9B:
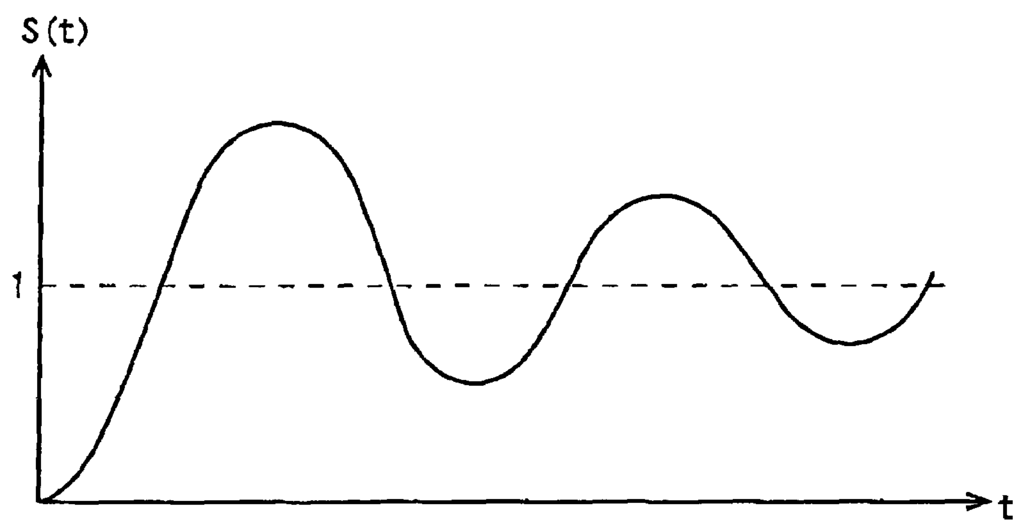

FIGS. 9A and 9B show examples of a step response of a filter. FIG. 9A shows a step response of a primary filter, while FIG. 9B shows a step response of a secondary filter. In a case where the deterministic jitter application unit 104 generates deterministic jitter by using a primary filter, that primary filter has the step response shown in FIG. 9A. Since the step response of the primary filter smoothly increases with the time, as shown in FIG. 9A, the amplitude modulation described in FIG. 3 does not occur. Thus, in the case of generating the deterministic jitter by means of the primary filter, a bit error caused by the amplitude modulation is not detected, but only a bit error caused by jitter can be detected.

Figure 2:
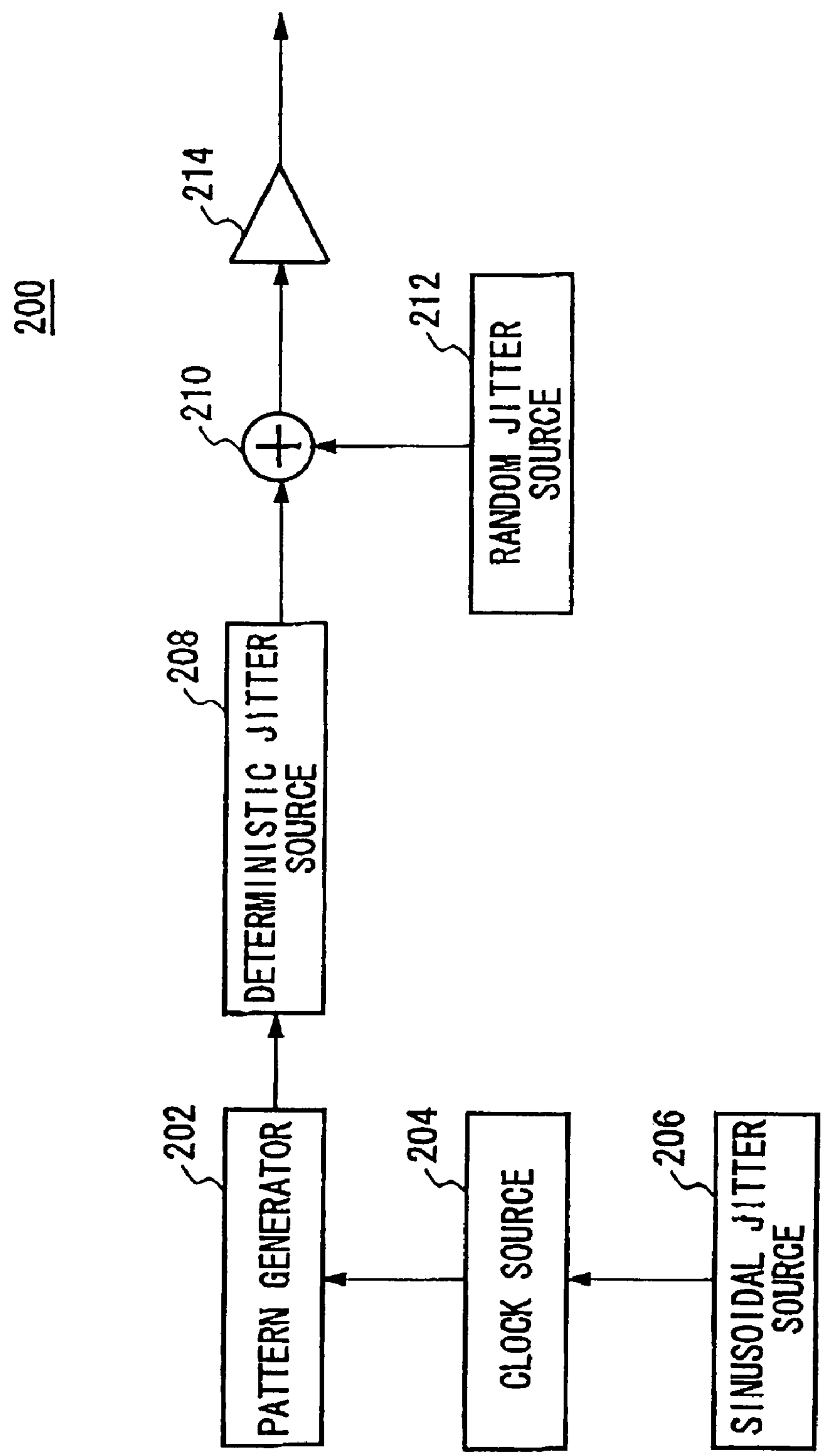
FIG. 2 schematically shows a structure of a conventional jitter application device 200 for applying jitter to an input signal.
Figure 3A:
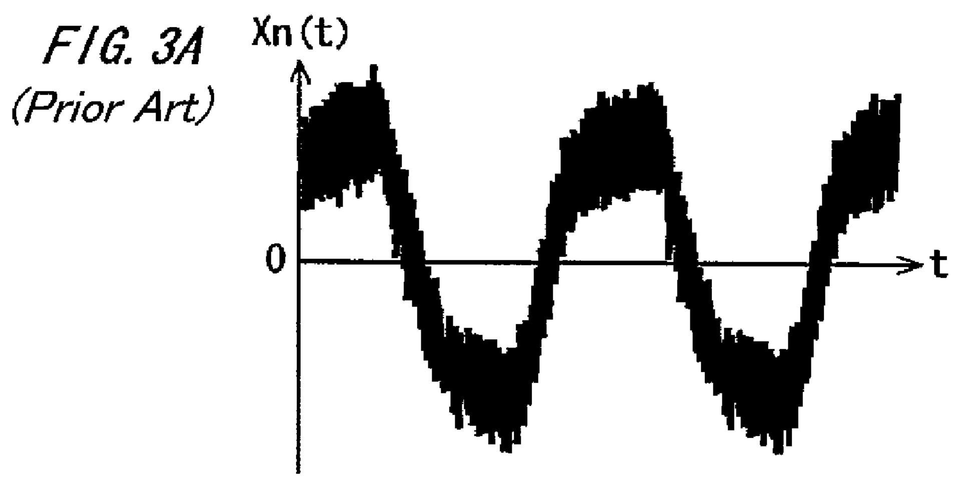
FIGS. 3A-3C explain an operation of a limiting amplifier 214.
Figure 3B:
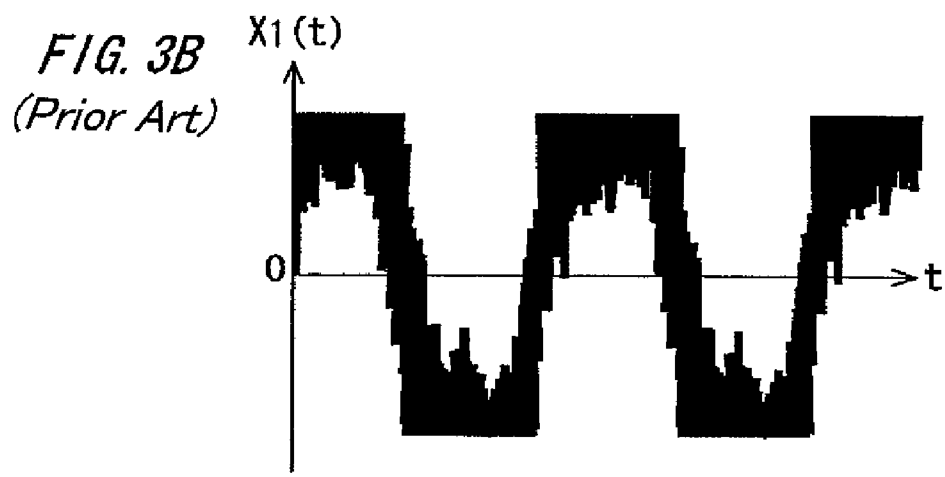
Figure 3C:
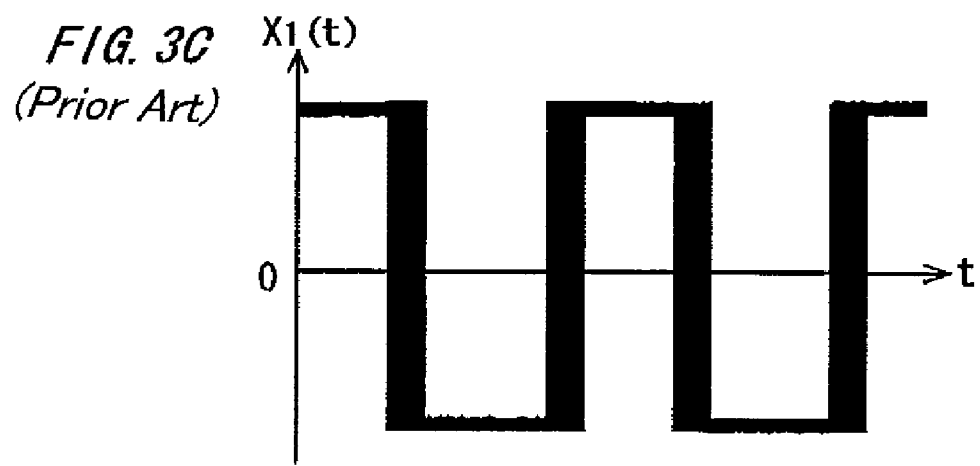

On the other hand, in a case where deterministic jitter is applied to the input signal by using a secondary filter, the amplitude modulation described in FIG. 3 occurs because the secondary filter has the step response shown in FIG. 9B. Thus, the bit error caused by the amplitude modulation is detected and jitter tolerance of the electronic device 10 cannot be detected with high precision in some cases. However, since the testing device 100 of this example generates deterministic jitter by using the primary filter, it can detect jitter tolerance of the electronic device 10 with high precision.

Moreover, in a case of testing jitter tolerance outside a loop band of a clock recovery circuit such as a PLL, that is included in the electronic device 10, it is necessary to apply jitter having a component of a frequency that is higher than a cut-off frequency of a loop filter of the clock recovery circuit. For example, a cut-off frequency of a loop filter used in a clock recovery circuit of a 2.5-Gbps communication device is 1 MHz or higher. By generating jitter by means of a cable, it is possible to generate jitter having a component of a frequency sufficiently higher than that cut-off frequency.

Figure 10:
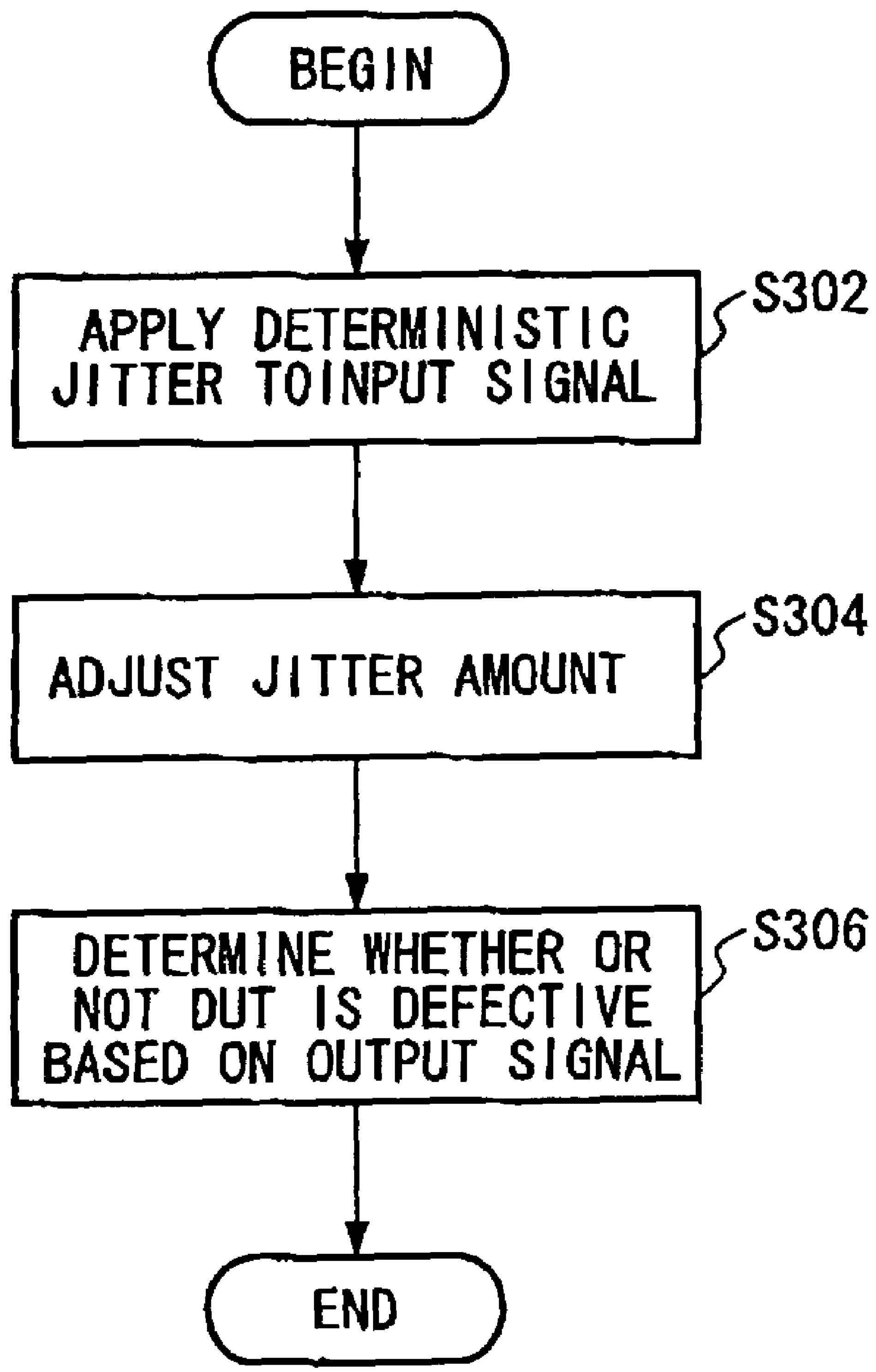
FIG. 10 is a flowchart of an exemplary testing method for testing the electronic device 10.

FIG. 10 is a flowchart of an exemplary testing method for testing the electronic device 10. This testing method may be performed using the testing device 100 described in conjunction with FIG. 8.

In Step S302, deterministic jitter is applied to an input signal. In this step, the deterministic jitter is applied to the input signal by means of the deterministic jitter application unit 104 without causing any amplitude modulation component in the input signal. The magnitude of the deterministic jitter generated by the deterministic jitter application unit 104 is controlled by the jitter amount controller 106 in Step S304. Then, in Step S306, it is determined whether or not the electronic device 10 is defective based on an output signal output from the electronic device 10 in accordance with the input signal.

In the above procedure, the jitter amount controller 106 determines the magnitude of the deterministic jitter based on a threshold value of a peak-to-peak value of alignment jitter between the input signal and a recovered clock signal recovered by the electronic device 10 from the input signal. More specifically, the jitter amount controller 106 determines a peak-to-peak value of the deterministic jitter so as to satisfy Expression (22) or (25). Then, in Step S304, the jitter amount Controller 106 adjusts the deterministic jitter application unit 104 in such a manner that the deterministic jitter having the thus determined peak-to-peak value as its amplitude is applied to the input signal.

The threshold value of the peak-to-peak value of alignment jitter, $\Delta_{th,PP}$ may be set in accordance with the method described in Section (5) of the principle of the testing device and testing method according to this embodiment of the present invention. Moreover, the jitter amount controller 106 may use a peak-to-peak value of alignment jitter measured by the testing device 100 for a non-defective electronic device 10 or a minimum value of alignment jitter measured by the testing device 100 for a plurality of non-defective electronic devices 10, as the threshold value $\Delta_{th,PP}$. Alternatively, the threshold value $\Delta_{th,PP}$ may be determined based on statistics of alignment jitter measured by the testing device 100 for a plurality of electronic devices 10, i.e., an average and a variance of the alignment jitter, for example.

Figure 11:
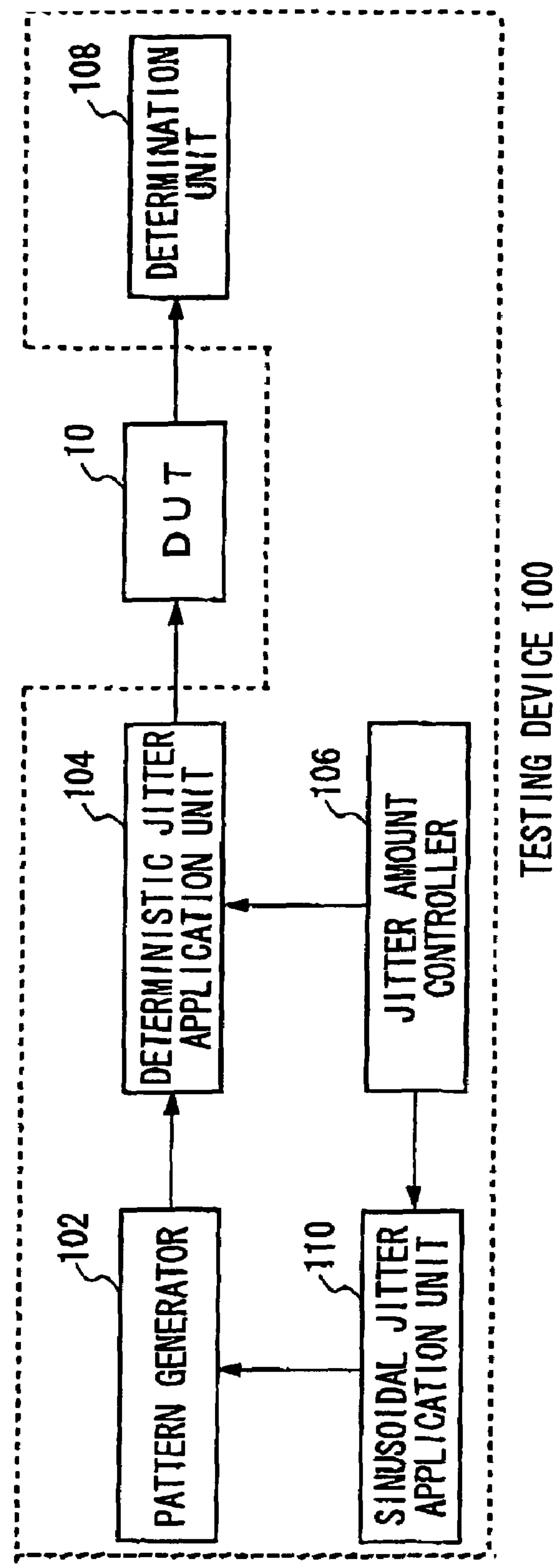
FIG. 11 shows another exemplary structure of the testing device 100.

FIG. 11 illustrates another exemplary structure of the testing device 100. In this example, the testing device 100 includes the structure of the testing device 100 described in FIG. 8 and further includes a sinusoidal jitter application unit 110. The components in FIG. 11 that are labeled with the same reference numerals as those in FIG. 8 have the same structures and functions as the components described in conjunction with FIG. 8, except for the following.

The sinusoidal jitter application unit 110 applies sinusoidal jitter to the input signal generated by the pattern generator 102. For example, the sinusoidal jitter application unit 110 modulates a phase of a clock the pattern generator 102 uses for generating the input signal, with a sine wave, thereby generating sinusoidal jitter. The sinusoidal jitter application unit 110 may generate sinusoidal jitter having a single frequency component or a plurality of frequency components.

The jitter amount controller 106 controls the magnitude of the sinusoidal jitter applied by the sinusoidal jitter application unit 110 to the input signal, as well as the magnitude of the deterministic jitter applied by the deterministic jitter application unit 104 to the input signal. According to the testing device 100 of this example, it is possible to apply jitter having the magnitude that is predetermined, containing deterministic jitter and sinusoidal jitter, to the input signal.

Figure 12:
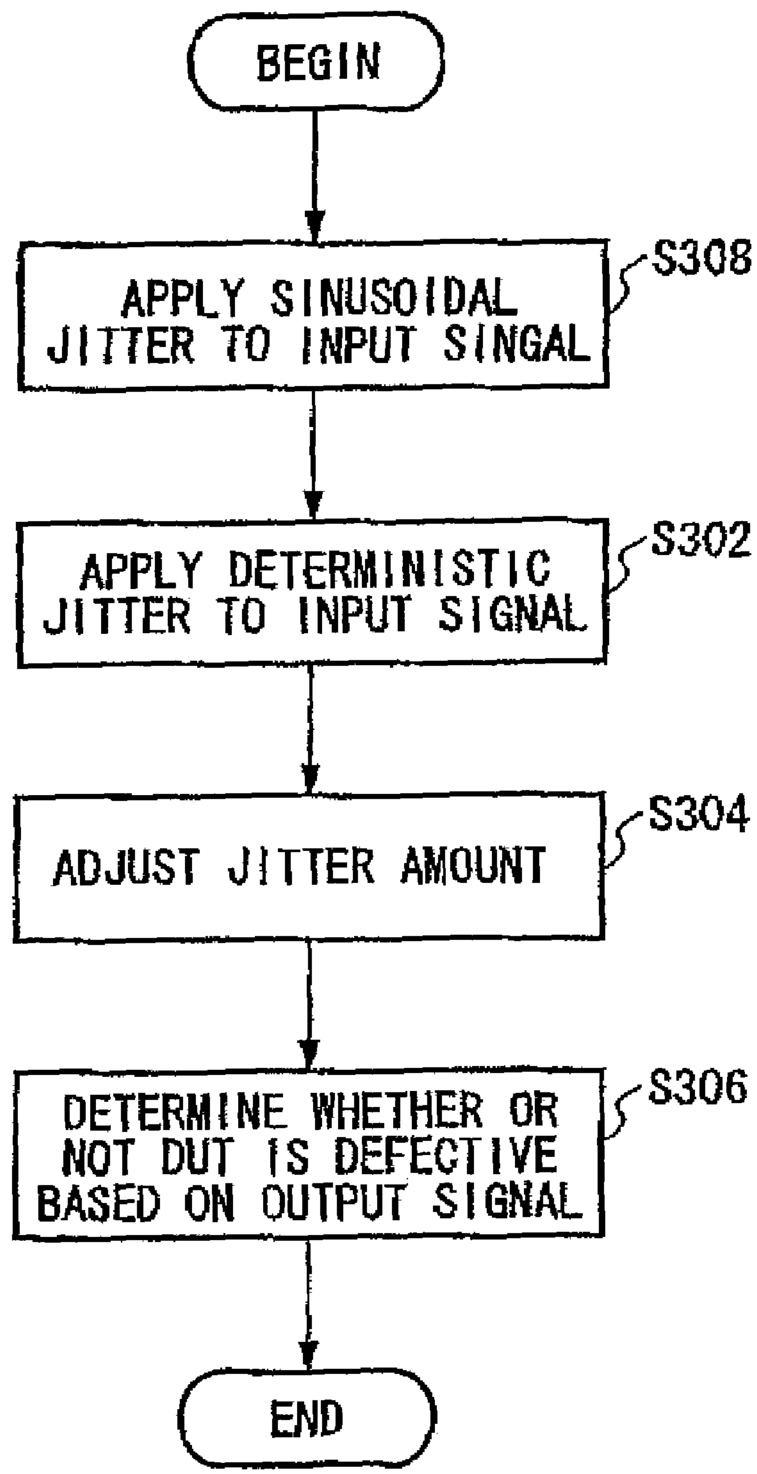
FIG. 12 is a flowchart of another exemplary testing device for testing the electronic device 10.

FIG. 12 is a flowchart of another exemplary testing method for testing the electronic device 10 according to the present invention. The testing method of this example includes the steps of the testing method shown in FIG. 10 and further includes a step of applying sinusoidal jitter. Step S308 applies sinusoidal jitter to the input signal by using the sinusoidal jitter application unit 110 described referring to FIG. 11. Then, the processes shown in Steps S302-S306 are performed, thereby determining whether or not the electronic device 10 is defective.

In the above procedure, the jitter amount controller 106 further determines the magnitude of the sinusoidal jitter based on the threshold value of alignment jitter between the input signal and the recovered clock signal recovered by the electronic device 10 from the input signal, and a jitter transfer function of a non-defective electronic device 10. Determination of the magnitude of the deterministic jitter and that of the sinusoidal jitter is described below.

(1) Determination of Deterministic Jitter and Sinusoidal Jitter 1

In a case of generating sinusoidal jitter and deterministic jitter, that are respectively shown in Sections (4-1) and (4-3) of the principle of the testing device and testing method according to this embodiment of the present invention, the jitter amount controller 106 determines the magnitude of each jitter in accordance with an exemplary method described below.

First, in the jitter amount controller 106, a sinusoidal jitter ratio and a deterministic jitter ratio are preset, that respectively indicate a ratio of sinusoidal jitter and that of deterministic jitter in the magnitude of jitter to be applied to the input signal.

Then, the jitter amount controller 106 determines the magnitude of sinusoidal jitter based on a sinusoidal jitter threshold value and the jitter transfer function in the non-defective electronic device 10. Please note that the sinusoidal jitter threshold value is obtained by multiplying the threshold value $\Delta_{th,PP}$ of the peak-to-peak value of alignment jitter by the above-described sinusoidal jitter ratio. For example, the jitter amount controller 106 may determine the magnitude of sinusoidal jitter by replacing the threshold value $\Delta_{th,PP}$ with the sinusoidal jitter threshold value in Expression (14) and then calculating the amplitude A that satisfies Expression (14).

The jitter amount controller 106 also determines the magnitude of deterministic jitter based on a deterministic jitter threshold value and the jitter transfer function. Please note that the deterministic jitter threshold value is obtained by subtracting the above-described sinusoidal jitter threshold value from the threshold value $\Delta_{th,PP}$ of the peak-to-peak value of alignment jitter. For example, the jitter amount controller 106 may determine the magnitude of deterministic jitter by replacing the threshold value $\Delta_{th,PP}$ with a deterministic jitter threshold value in Expression (22) or (25). This deterministic jitter threshold value is obtained by multiplying the threshold value $\Delta_{th,PP}$ of the peak-to-peak value of alignment jitter by the above-described deterministic jitter ratio.

(2) Determination of Deterministic Jitter and Sinusoidal Jitter 2

In a case of generating sinusoidal jitter and deterministic jitter shown in Section (4-4) of the principle of the testing device and testing method according to this embodiment, the jitter amount controller 106 determines the magnitude of each of a plurality of frequency components contained in the sinusoidal jitter based on the threshold value of the peak-to-peak value of alignment jitter and the jitter transfer function. The jitter amount controller 106 makes this determination in accordance with an exemplary method described below.

First, in the jitter amount controller 106, a sinusoidal jitter ratio and a deterministic jitter ratio are preset, that respectively indicate a ratio of sinusoidal jitter and that of deterministic jitter in the magnitude of the jitter to be applied to the input signal. In this case, the sinusoidal jitter ratio is set as a sum of predetermined frequency component ratios each of which indicates a ratio of a corresponding one of the frequency components included in the sinusoidal jitter.

The jitter amount controller 106 determines, for each of a plurality of frequency components in the sinusoidal jitter, the magnitude of that frequency component based on a corresponding frequency component threshold value, that is obtained by multiplying the threshold value $\Delta_{th,PP}$ of the peak-to-peak value of alignment jitter by the predetermined frequency component ratio of that frequency component, and the jitter transfer function in the electronic device 10. For example, the jitter amount controller 106 may calculate the amplitude $A_k$ for each of a plurality of frequency components of the sinusoidal jitter so as to make the threshold value $\Delta_{,PP}$ in Expression (18) equal to a sinusoidal jitter threshold value, thereby determining the magnitude of the sinusoidal jitter containing those frequency components.

The jitter amount controller 106 also determines the magnitude of the deterministic jitter based on a deterministic threshold value. The deterministic threshold value is obtained by subtracting the sinusoidal jitter threshold value, i.e., the sum of the frequency component threshold values, from the threshold value $\Delta_{th,PP}$ of the peak-to-peak value of alignment jitter. For example, the jitter amount controller 106 may replace the threshold value $\Delta_{th,PP}$ in Expression (22) or (25) with the deterministic jitter threshold value so as to determine the magnitude of the deterministic jitter. Please note that the deterministic jitter threshold value mentioned above is a value obtained by multiplying the threshold value $\Delta_{th,PP}$ of the peak-to-peak value of alignment jitter by the deterministic jitter ratio.

The jitter amount controller 106 can obtain the magnitude of the sinusoidal jitter and that of the deterministic jitter that satisfy Expression (30), in accordance with the above procedure.

In the above sections (1) and (2), the testing device 100 may include a jitter transfer function estimation unit in order to obtain the jitter transfer function used for determining the magnitude of the jitter. The jitter transfer function estimation unit performs calculation shown in Expression (6), (7), (8) or (9), for example, based on a timing jitter series of the input signal and a timing jitter series of the recovered clock signal recovered by the electronic device 10 that is non-defective from the input signal, thereby obtaining the jitter transfer function in the non-defective electronic device 10. The jitter transfer function estimation unit may determine the jitter transfer function used by the jitter amount controller 106, based on statistics of the jitter transfer function measured for a plurality of non-defective electronic device 10.

In the examples shown in FIGS. 8-12, a description was made with assumption that the electronic device 10 has one input and one output. However, in a case where the electronic device 10 has a plurality of inputs and a plurality outputs, the testing device 100 may include a plurality of pattern generators 102, a plurality of deterministic jitter application units 104, a plurality of jitter amount controllers 106, a plurality of sinusoidal jitter application units 110 and a plurality of determination units 108 so as to correspond to a plurality of inputs and outputs. Moreover, in the examples shown in FIGS. 8 and 11, the pattern generator 102 may be provided outside the testing device 100.

Figure 13:
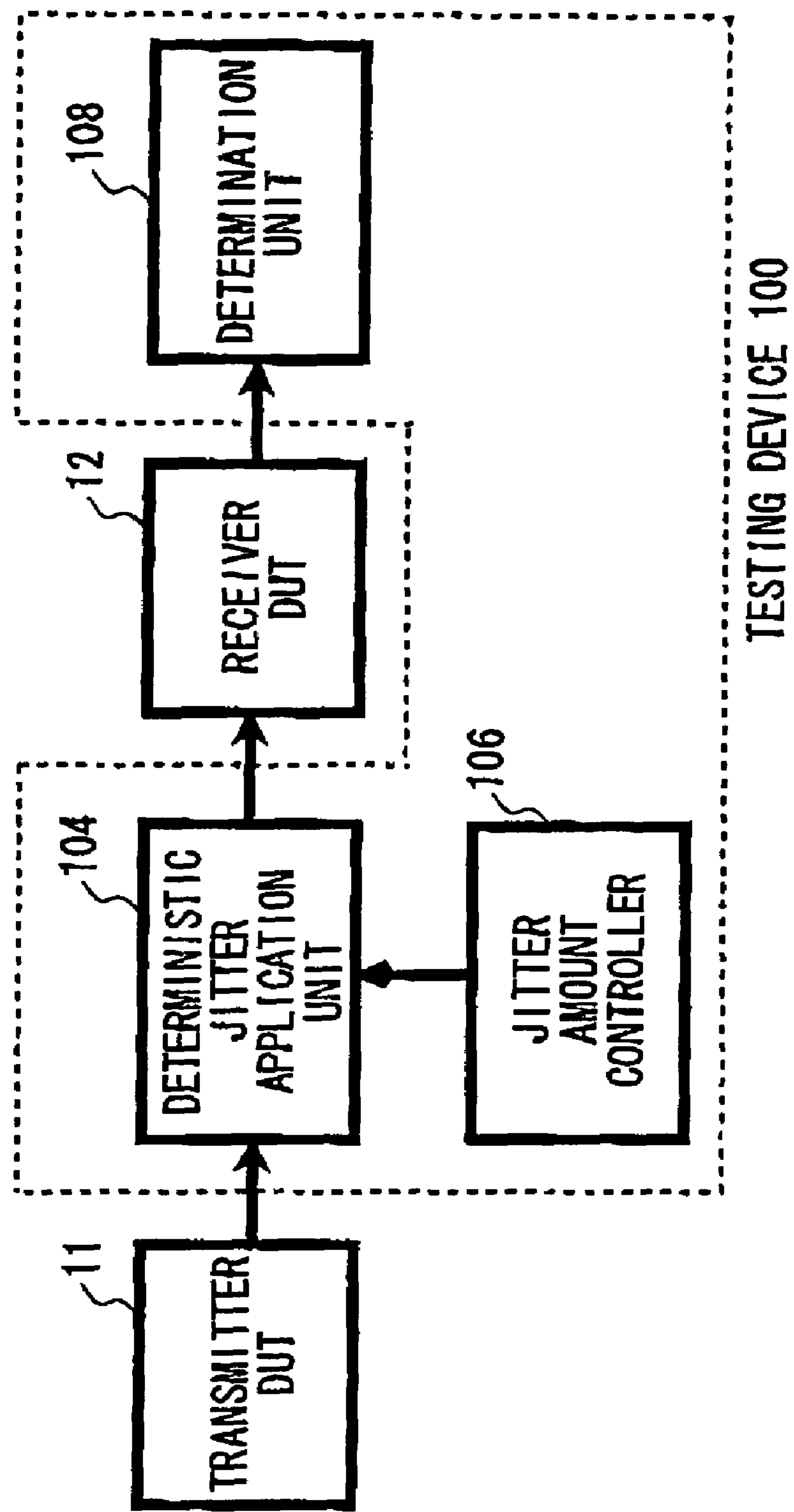
FIG. 13 shows another exemplary structure of the testing device 100.

FIG. 13 illustrates another exemplary structure of the testing device 100. The testing device 100 shown in FIG. 13 uses a signal generated by a transmitting electronic device (transmitter DUT) 11 as an input signal to a receiving electronic device (receiver DUT) 12, in place of the input signal generated by the pattern generator 102 shown in FIG. 8. The components in FIG. 13 that are labeled with the same reference numerals as those in FIG. 8 have the same functions and structures as the components described in conjunction with FIG. 8, except for the following.

The testing device 100 of this example includes a deterministic jitter application unit 104, a jitter amount controller 106 and a determination unit 108. The deterministic jitter application unit 104 applies deterministic jitter to the signal that was generated by the transmitting electronic device 11 and was transmitted to the receiving electronic device 12 as the input signal without causing an amplitude modulation component in that input signal. The jitter amount controller 106 controls the magnitude of the deterministic jitter applied by the deterministic jitter application unit 104 to the input signal, in a similar manner to that of the jitter amount controller 106 shown in FIG. 8. The testing method performed by the testing device 100 of this example is the same as that shown in FIG. 10, except that the deterministic application unit 104 applies deterministic jitter to the input signal input from the transmitting electronic device 11 in Step S302 and the determination unit 108 determines whether or not the transmitting electronic device 11 and the receiving electronic device 12 are defective based on an output signal output from the receiving electronic device 12 in Step S306.

The testing device 100 shown in FIG. 13 may further include a sinusoidal jitter application unit 110 for applying sinusoidal jitter to the input signal input from the transmitting electronic device 11. In this case, the testing method to be performed by the testing device 100, is the same as that shown in FIG. 12 except that the transmitting electronic device 11 transmits a plurality of signals, jitter is applied to each of those signals by the sinusoidal jitter application unit 110 and the deterministic jitter application unit 104 and those signals with the applied jitter are input to the receiving electronic device 12; and it is determined whether or not the transmitting electronic device 11 and the receiving electronic device 12 are defective based on a plurality of output signals in response to those signals.

Figure 14:
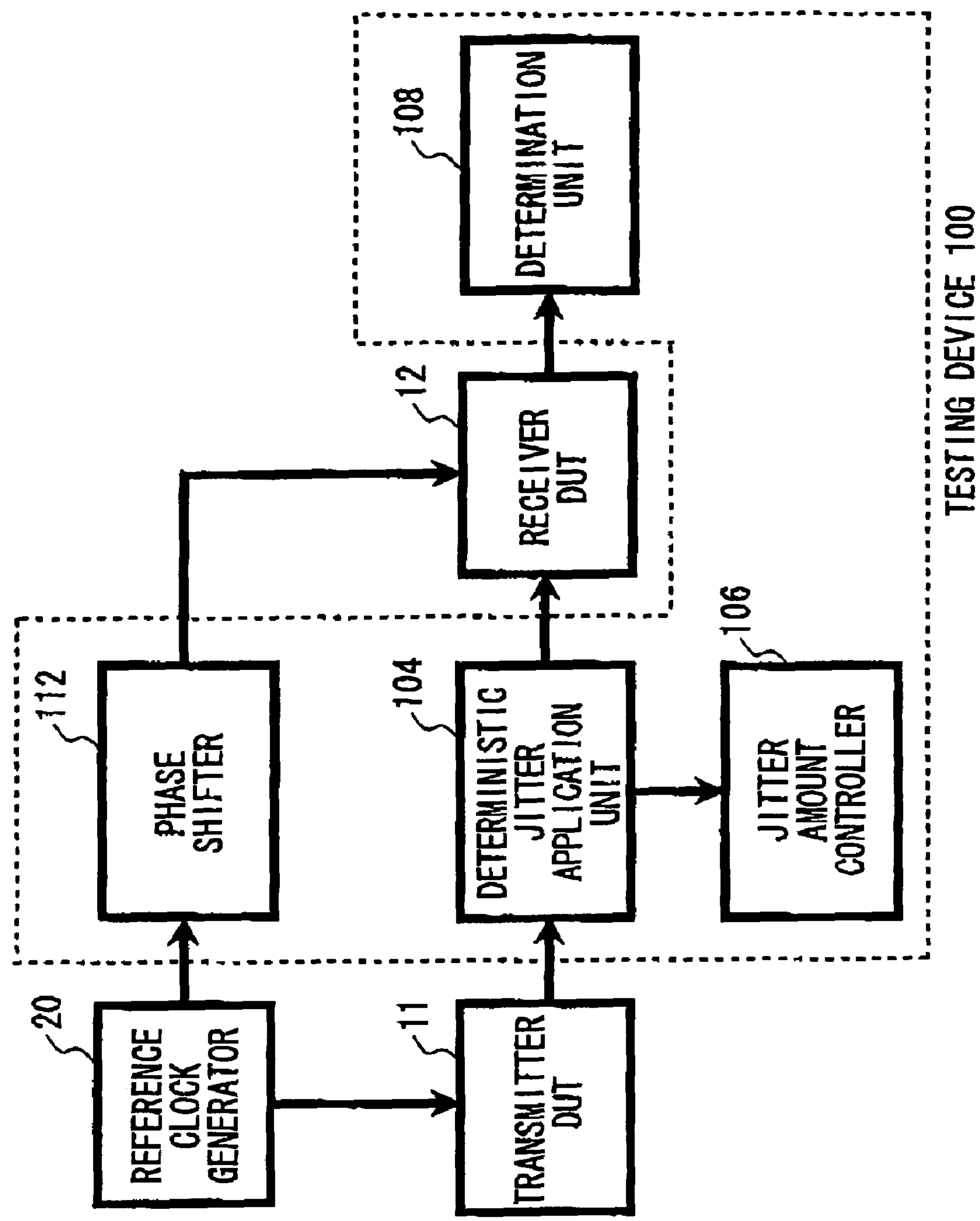
FIG. 14 shows another exemplary structure of the testing device 100.

FIG. 14 illustrates another exemplary structure of the testing device 100. The testing device 100 of this example tests the transmitting electronic device 11 and the receiving electronic device 12 that work based on a reference clock signal generated by a reference clock generator 20. The receiving electronic device 12 receives a data signal (input signal) generated by the transmitting electronic device 11 and the reference clock signal as its input and samples the input signal based on the reference clock signal.

The testing device 100 includes the structure of the testing device 100 shown in FIG. 13 and further includes a phase shifter 112. The phase shifter 112 shifts a phase of the reference clock signal generated by the reference clock generator 20 to provide a predetermined static phase difference between the reference clock signal input to the transmitting electronic device 11 and the reference clock signal input to the receiving electronic device 12. By using this phase difference, the testing device 100 can conduct a test while a phase error of the reference clock signal in a range accepted by the specifications of the transmitting electronic device 11 and receiving electronic device 12, for example, is provided to the transmitting electronic device 11 and the receiving electronic device 12.

Figure 15:
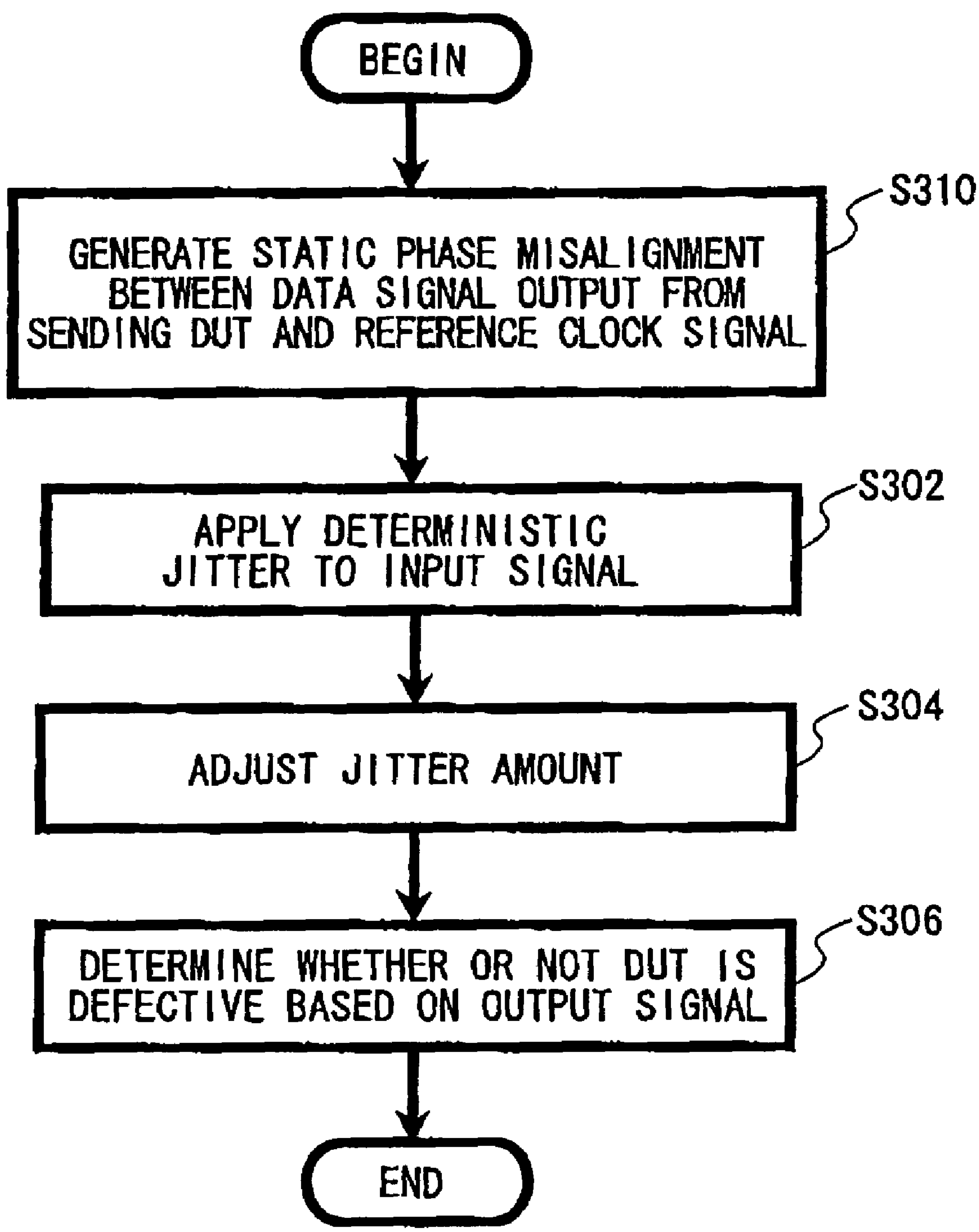
FIG. 15 is a flowchart of another exemplary testing device for testing the electronic device 10.

FIG. 15 is a flowchart of another exemplary testing method for testing the electronic device. The testing method of this example includes the steps of the testing method shown in FIG. 10 and further includes phase shifting step S310. The phase shifting step S310 shifts the phase of the reference clock signal generated by the reference clock generator 20 by means of the phase shifter 112 described in FIG. 14. The testing method to be performed by the testing device 100 of this example is the same as that shown in FIG. 10 except that the deterministic jitter application unit 104 applies deterministic jitter to the input signal input from the transmitting electronic device 11 in Step S302; the receiving electronic device 12 samples the input signal based on the reference clock signal input from the phase shifter 112; and the determination unit 108 determines whether or not the transmitting electronic device 11 and the receiving electronic device 12 are defective based on the output signal output from the receiving electronic device 12 in Step S306.

The testing device 100 shown in FIG. 14 may further include a sinusoidal jitter application unit 110 for applying sinusoidal jitter to the input signal input from the transmitting electronic device 11. In this case, the testing method to be performed by this testing device 100 is the same as that shown in FIG. 12 except that the phase shifting step S310 shifts the phase of the reference clock signal supplied to the receiving electronic device 12; a plurality of signals are transmitted from the transmitting electronic device 11, and are input to the receiving electronic device after the sinusoidal jitter application unit 110 and the deterministic jitter application unit 104 apply jitter to each of those signal; and it is determined whether or not the transmitting electronic device 11 and the receiving electronic device 12 are defective based on a plurality of output signals output in response to those signals.

Figure 16:
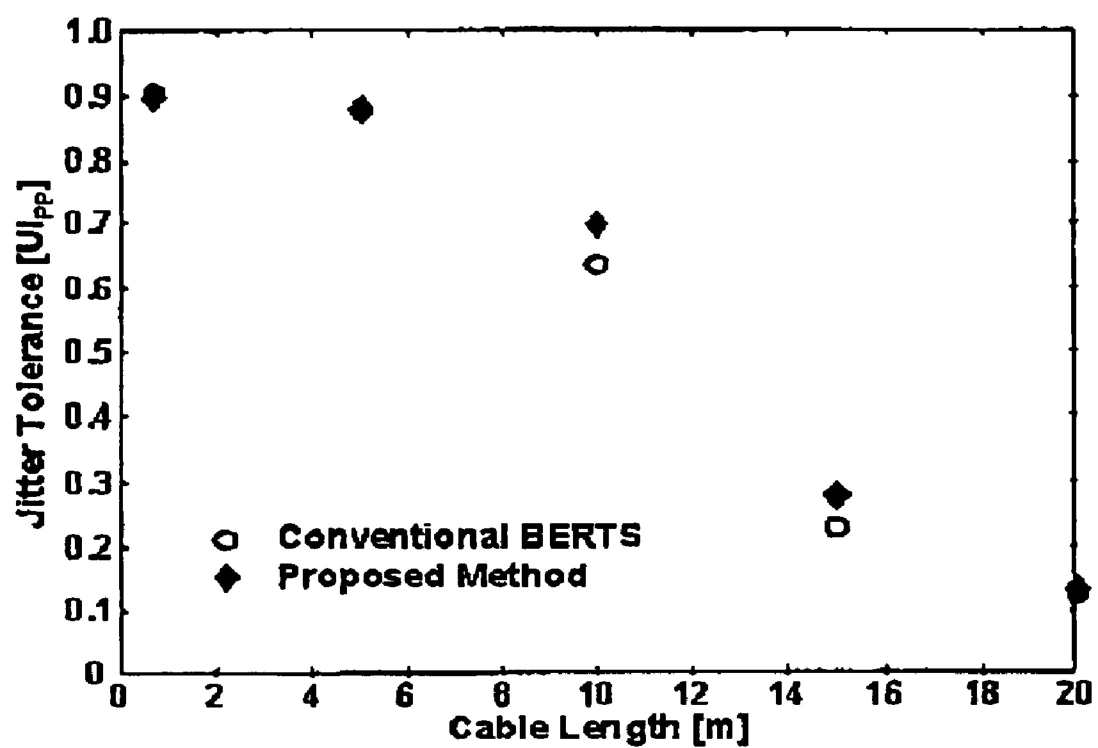
FIG. 16 shows an exemplary test result of the electronic device 10 by the testing method according to the embodiments of the present invention.

FIG. 16 shows an exemplary test result of the electronic device 10 by the testing method according to the present embodiment of the present invention. In this example, the electronic device 10 is a 2.5-Gbps deserializer. In this measurement, three-tone (90 kHz, 800 kHz and 7 MHz) sinusoidal jitter that has the same amplitude at 90 kHz, 800 kHz and 7 MHz and deterministic jitter were applied to an input signal of the deserializer, and the minimum amplitude of the three-tone sinusoidal jitter at which the deserializer generated a bit error was measured. The deterministic jitter was generated by using a cable and a limiting amplifier, and the amount of the deterministic jitter was changed by changing the length of the cable from 0.7 m to 20 m.

In a case where the amplitude of the sinusoidal jitter is constant, the amplitude $A_k$ of each sinusoidal jitter in Expression (15) is represented by $A_k = A_{3\text{-}tone}/3$ where $A_{3\text{-}tone}$ represents the amplitude of the 3-tone sinusoidal jitter. Thus, Expression (30) can be changed as follows.

$$\sum_{k=1}^{3} \frac{A_{3-tone}}{3} \cdot \left| H_J(f_k) - 1 \right| + \Delta\theta d_{deterministic,PP} < \Delta_{th,PP}[UI_{PP}] \quad (31)$$

The bit error occurs when the peak-to-peak value of alignment jitter has exceeded the threshold value $\Delta_{th,PP}$ (for example, 0.5 UIpp). Therefore, the minimum amplitude $A_{3\text{-}tone}$ of the three-tone sinusoidal jitter is represented by the following expression.

$$A_{3-tone} = \frac{\Delta_{th,PP} - \Delta_{deterministic,PP}}{\sum_{k=1}^{3} \frac{|H_J(f_k) - 1|}{3}} [UI_{PP}] \quad (32)$$

Inn a case where the deterministic jitter was changed, as shown in FIG. 16, the value obtained by Expression (32) is approximately coincident with the result measured by a bit error rate testing system.

According to the testing device and testing method of the present embodiment, it is possible to determine whether or not a device under test is defective only by using a deterministic jitter source that can be formed by a cable, filter and the like. Thus, the device cost of the jitter source can be made minimum and therefore the testing cost of the device can be largely reduced.

Moreover, the testing device and testing method of the present embodiment, the need of measurement of a bit error rate that requires much time can be eliminated by determining whether or not a bit error occurs in an output of the device under test. Thus, a very high-speed device test can be achieved.

In addition, according to the testing device and test ing method of the present embodiment, at least one parametric defect at a jitter frequency of a plurality of sine waves or outside a loop band of the device under test can be simultaneously tested by applying sinusoidal jitter and deterministic jitter to an input data stream input to the device under test and determining whether or not a bit error occurs in the output of the device under test. Thus, a very high-speed test of the device can be achieved.

Furthermore, the testing device and testing method of the present embodiment can provide a test corresponding to an actual environment in which the device under test is used, instead of a test in the worst case. Therefore, reliability of the device test, i.e., correlation between the test result and the defect in the actual operating environment can be improved.

In addition, various modifications may be made to the embodiments described above. For example, the testing device 100 shown in FIG. 11 may include no deterministic jitter application unit 104. Instead, the testing device 100 may have a structure in which the input signal to which sinusoidal jitter is applied by the sinusoidal jitter application unit 110 is supplied from the pattern generator 102 to the electronic device 10. In this case, the jitter amount controller 106 may determine the magnitude of the sinusoidal jitter in accordance with the method described in Section (4-1) or (4-2) of the principle of the testing device and testing method according to the present invention.

As is apparent from the above, according to the present invention, jitter tolerance of an electronic device can be tested with high precision.

Although the present invention has been described by way of exemplary embodiments, it should be understood that those skilled in the art might make many changes and substitutions without departing from the spirit and the scope of the present invention which is defined only by the appended claims.

What is claimed is:

1. A testing device for testing an electronic device, comprising:

a deterministic jitter application unit operable to apply deterministic jitter to a given input signal without causing an amplitude modulation component and supply said input signal to said electronic device;

a jitter amount controller operable to control magnitude of said deterministic jitter generated by said deterministic jitter application unit; and a determination unit operable to determine whether or not said electronic device is defective based on an output signal output from said electronic device in accordance with said input signal, wherein said jitter amount controller determines said magnitude of said deterministic jitter based on a threshold value of a peak-to-peak value of alignment jitter between said input signal and a recovered clock signal recovered by said electronic device from said input signal.

2. A testing device as claimed in claim 1, wherein said deterministic jitter application unit includes a primary filter operable to transmit said input signal and generate said deterministic jitter.

3. A testing device as claimed in claim 1, wherein said deterministic jitter application unit includes a cable operable to transmit said input signal and generate said deterministic jitter.

4. A testing device as claimed in claim 1, further comprising a sinusoidal jitter application unit operable to apply sinusoidal jitter to said input signal, wherein said jitter amount controller further controls magnitude of said sinusoidal jitter generated by said sinusoidal jitter application unit.

5. A testing device as claimed in claim 4, wherein said jitter amount controller determines said magnitude of said sinusoidal jitter based on a threshold value of a peak-to-peak value of alignment jitter between said input signal and a recovered clock signal recovered by said electronic device from said input signal, and a jitter transfer function in a nondefective electronic device.

6. A testing device as claimed in claim 5, wherein said jitter amount controller determines said magnitude of said sinusoidal jitter based on a sinusoidal jitter threshold value obtained by multiplying said threshold value of said peak-to-peak value of said alignment jitter by a sinusoidal jitter ratio that is predetermined, and said jitter transfer function, and determines said magnitude of said deterministic jitter based on a deterministic jitter threshold value obtained by subtracting said sinusoidal jitter threshold value from said threshold value of said peak-to-peak value of said alignment jitter, and said jitter transfer function.

7. A testing device as claimed in claim 5, wherein said jitter amount controller includes a jitter transfer function estimation unit operable to obtain said jitter transfer function based on a timing jitter series of said input signal and a timing jitter series of said recovered clock signal recovered by said electronic device from said input signal.

8. A testing device as claimed in claim 5, wherein said sinusoidal jitter application unit applies said sinusoidal jitter having a plurality of frequency components to said input signal, and said jitter amount controller determines magnitude of each of said frequency components of said sinusoidal jitter based on said threshold value of said peak-to-peak value of said alignment jitter and said jitter transfer function.

9. A testing device as claimed in claim 8, wherein said jitter amount controller determines said magnitude of each of said plurality of frequency components of said sinusoidal jitter based on a frequency-component threshold value obtained by multiplying said threshold value of said peak-to-peak value of said alignment jitter by a frequency-component ratio that is predetermined for that frequency component, and said jitter transfer function, and determines said magnitude of said deterministic jitter based on a deterministic jitter threshold value obtained by subtracting a sum of said frequency-components threshold values corresponding to said plurality of frequency components, from said threshold value of said peak-to-peak value of said alignment jitter.

10. A testing device as claimed in claim 1, wherein said electronic device receives said input signal and a reference clock signal as its input and samples said input signal based on said reference clock signal, wherein said testing device further comprises a phase shifter operable to shift a phase of said reference clock signal.

11. A testing device for testing an electronic device, comprising:

a sinusoidal jitter application unit operable to apply sinusoidal jitter to a given input signal and supply said input signal with said sinusoidal jitter to said electronic device;

a jitter amount controller operable to control magnitude of said sinusoidal jitter applied by said sinusoidal jitter application unit; and a determination unit operable to determine whether or not said electronic device is defective based on an output signal output from said electronic device in accordance with said input signal, wherein said jitter amount controller determines said magnitude of said sinusoidal jitter based on a threshold value of a peak-to-peak value of alignment jitter between said input signal and a recovered clock signal recovered by said electronic device from said input signal, and a jitter transfer junction in said electronic device that is nondefective.

12. A testing method for testing an electronic device, comprising:

applying deterministic jitter to a given input signal without causing an amplitude modulation component and supplying said input signal with said deterministic jitter to said electronic device;

controlling magnitude of said deterministic jitter applied in the application of said deterministic jitter; and determining whether or not said electronic device is defective based on an output signal output from said electronic device in accordance with said input signal;

wherein the magnitude of the deterministic jitter is determined based on a threshold value of a peak-to-peak value of alignment jitter between said input signal and a recovered clock signal recovered by said electronic device from said input signal.

13. A testing method as claimed in claim 12, wherein said deterministic jitter is generated by using a primary filter that transmit said input signal in said application of said deterministic jitter.

14. A testing method as claimed in claim 12, wherein said deterministic jitter is generated by using a cable that transmits said input signal in said application of said deterministic jitter.

15. A testing method as claimed in claim 12, further comprising applying sinusoidal jitter to said input signal.

16. A testing method as claimed in claim 15, wherein said sinusoidal jitter having a plurality of frequency components is applied to said input signal in said application of said sinusoidal jitter.

17. A testing method for testing an electronic device, comprising:

applying sinusoidal jitter to a given input signal and supplying said input signal with said sinusoidal jitter to said electronic device;

controlling magnitude of said sinusoidal jitter applied in said application of said sinusoidal jitter; and determining whether or not said electronic device is defective based on an output signal output from said electronic device in accordance with said input signal, wherein said controlling of said magnitude of said sinusoidal jitter determines said magnitude of said sinusoidal jitter based on a threshold value of a peak-to-peak value of alignment jitter between said input signal and a recovered clock signal recovered by said electronic device from said input signal, and a jitter transfer function of said electronic device that is nondefective.

* * * * *